(12) United States Patent
Ikeda et al.

(10) Patent No.: US 12,225,761 B2
(45) Date of Patent: Feb. 11, 2025

(54) DISPLAY DEVICE AND FABRICATION METHOD THEREOF

(71) Applicant: SEMICONDUCTOR ENERGY LABORATORY CO., LTD., Atsugi (JP)

(72) Inventors: Hisao Ikeda, Kanagawa (JP); Tomoya Aoyama, Kanagawa (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1097 days.

(21) Appl. No.: 17/043,781

(22) PCT Filed: Apr. 25, 2019

(86) PCT No.: PCT/IB2019/053404
§ 371 (c)(1),
(2) Date: Sep. 30, 2020

(87) PCT Pub. No.: WO2019/215530
PCT Pub. Date: Nov. 14, 2019

(65) Prior Publication Data
US 2021/0020868 A1 Jan. 21, 2021

(30) Foreign Application Priority Data
May 11, 2018 (JP) .................................. 2018-091821

(51) Int. Cl.
*H10K 50/856* (2023.01)
*G06F 1/16* (2006.01)
(Continued)

(52) U.S. Cl.
CPC ......... *H10K 50/856* (2023.02); *G06F 1/1609* (2013.01); *H10K 59/131* (2023.02); *G02B 27/0172* (2013.01); *G02B 2027/0178* (2013.01)

(58) Field of Classification Search
CPC ...... H10K 50/11; H10K 59/38; H10K 50/852; H10K 59/35; H10K 71/00; H01L 29/7869;
(Continued)

(56) References Cited

U.S. PATENT DOCUMENTS 6,580,094 B1 6/2003 Yamazaki et al.
6,809,343 B2 10/2004 Yamazaki et al.
(Continued)

FOREIGN PATENT DOCUMENTS

CN 001964064 A 5/2007
CN 101378071 A 3/2009
(Continued)

OTHER PUBLICATIONS

Vieri.C et al., "An 18 megapixel 4.3" 1443 ppi 120 Hz OLED display for wide field of view high acuity head mounted displays", J. Soc. Inf. Display (Journal of the Society for Information Display), May 1, 2018, vol. 26, No. 5, pp. 314-324.
(Continued)

*Primary Examiner* — Tony Tran
(74) *Attorney, Agent, or Firm* — Fish & Richardson P.C.

(57) ABSTRACT

A high-resolution display device is provided. The display device includes a plurality of light-emitting units emitting light of different colors. The light-emitting unit has a microcavity structure and intensifies light with a specific wavelength. In the light-emitting units emitting light of different colors, reflective layers with different thicknesses are formed, an insulating layer is formed to cover the reflective layers, and then a top surface of the insulating layer is subjected to planarization treatment, whereby an insulating layer with different thicknesses is formed. After that, light-emitting elements emitting white light are formed over the planarized top surface of the insulating layer to overlap with (Continued)

the respective reflective layers, whereby the light-emitting units that intensify different colors due to different optical path lengths are separately formed.

13 Claims, 16 Drawing Sheets

(51) Int. Cl.
  *H10K 59/131* (2023.01)
  *G02B 27/01* (2006.01)
(58) Field of Classification Search
  CPC .......... H01L 27/1225; H01L 29/78696; H01L 29/78648; H01L 29/66969
  See application file for complete search history.

(56) References Cited

U.S. PATENT DOCUMENTS

| | | | |
|---|---|---|---|
| 7,279,752 | B2 | 10/2007 | Yamazaki et al. |
| 7,288,886 | B2 | 10/2007 | Jung et al. |
| 7,399,991 | B2 | 7/2008 | Seo et al. |
| 7,791,268 | B2 | 9/2010 | Jung et al. |
| 7,977,874 | B2 | 7/2011 | Matsuura et al. |
| 8,017,945 | B2 | 9/2011 | Yamazaki et al. |
| 8,237,360 | B2 | 8/2012 | Kinoshita |
| 8,513,882 | B2 | 8/2013 | Kinoshita |
| 8,648,345 | B2 | 2/2014 | Yamazaki et al. |
| 8,956,898 | B2 | 2/2015 | Sato et al. |
| 9,147,717 | B2 | 9/2015 | Furuie et al. |
| 9,153,796 | B2 | 10/2015 | Sato et al. |
| 9,236,425 | B2 | 1/2016 | Koshihara et al. |
| 9,240,571 | B2 | 1/2016 | Kim. et al. |
| 9,269,924 | B2 | 2/2016 | Nozawa et al. |
| 9,741,775 | B2 | 8/2017 | Sakamoto et al. |
| 10,084,022 | B2 | 9/2018 | Ikeda et al. |
| 10,381,424 | B2 | 8/2019 | Ohchi |
| 10,410,571 | B2 | 9/2019 | Kurokawa |
| 10,580,844 | B2 | 3/2020 | Ohchi |
| 2007/0103062 | A1 | 5/2007 | Jung et al. |
| 2009/0058290 | A1 | 3/2009 | Matsuura et al. |
| 2010/0052524 | A1* | 3/2010 | Kinoshita ............ H10K 50/852 313/506 |
| 2014/0295597 | A1 | 10/2014 | Sato et al. |
| 2015/0053955 | A1 | 2/2015 | Furuie et al. |
| 2016/0322437 | A1 | 11/2016 | Sakamoto et al. |
| 2017/0104036 | A1 | 4/2017 | Maeda |
| 2018/0012943 | A1 | 1/2018 | Ikeda et al. |
| 2018/0040274 | A1 | 2/2018 | Kurokawa |
| 2018/0269267 | A1 | 9/2018 | Ohchi |
| 2020/0258962 | A1 | 8/2020 | Ohchi |

FOREIGN PATENT DOCUMENTS

| | | |
|---|---|---|
| CN | 101661951 A | 3/2010 |
| CN | 104078422 A | 10/2014 |
| CN | 104425555 A | 3/2015 |
| CN | 104795421 A | 7/2015 |
| CN | 106571431 A | 4/2017 |
| CN | 108029175 A | 5/2018 |
| EP | 1096571 A | 5/2001 |
| EP | 2159843 A | 3/2010 |
| EP | 3694002 A | 8/2020 |
| JP | 2002-324673 A | 11/2002 |
| JP | 2007-134327 A | 5/2007 |
| JP | 2009-054507 A | 3/2009 |
| JP | 2010-056017 A | 3/2010 |
| JP | 2011-216280 A | 10/2011 |
| JP | 2013-089444 A | 5/2013 |
| JP | 2013-161520 A | 8/2013 |
| JP | 2013-165014 A | 8/2013 |
| JP | 2013-225620 A | 10/2013 |
| JP | 2014-191962 A | 10/2014 |
| JP | 2014-235959 A | 12/2014 |
| JP | 2015-041489 A | 3/2015 |
| JP | 2016-212979 A | 12/2016 |
| JP | 2017-037341 A | 2/2017 |
| JP | 2017-062941 A | 3/2017 |
| JP | 2018-014320 A | 1/2018 |
| JP | 2018-036627 A | 3/2018 |
| JP | 2018-063399 A | 4/2018 |
| JP | 2018-063452 A | 4/2018 |
| KR | 2007-0048957 A | 5/2007 |
| KR | 2009-0023237 A | 3/2009 |
| KR | 2014-0087898 A | 7/2014 |
| KR | 2015-0021890 A | 3/2015 |
| KR | 2018-0015576 A | 2/2018 |
| KR | 2018-0056646 A | 5/2018 |
| TW | 200926887 | 6/2009 |
| TW | 201438201 | 10/2014 |
| TW | 201508897 | 3/2015 |
| WO | WO-2017/051622 | 3/2017 |

OTHER PUBLICATIONS

International Search Report (Application No. PCT/IB2019/053404) Dated Aug. 13, 2019.

Written Opinion (Application No. PCT/IB2019/053404) Dated Aug. 13, 2019.

Chinese Office Action (Application No. 201980030602.2) Dated Oct. 14, 2023.

* cited by examiner

DISPLAY DEVICE AND FABRICATION METHOD THEREOF

CROSS REFERENCE TO RELATED APPLICATIONS

This application is a U.S. National Phase Application under 35U.S.C. § 371 of International Application PCT/IB2019/053404, filed on Apr. 25, 2019, which is incorporated by reference and claims the benefit of a foreign priority application filed in Japan on May 11, 2018, as Application No. 2018-091821.

TECHNICAL FIELD

One embodiment of the present invention relates to a display device. One embodiment of the present invention relates to a method for fabricating a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, higher-resolution display panels have been required. As a device that requires a high-resolution display panel, a device for virtual reality (VR) or augmented reality (AR) has been actively developed in recent years.

Examples of a display device that can be used for a display panel include, typically, a liquid crystal display device, a light-emitting device including a light-emitting element such as an organic EL (Electro Luminescence) element or a light-emitting diode (LED), and electronic paper performing display by an electrophoretic method or the like.

The basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

In the above-described device for VR or AR that is wearable, a lens for focus adjustment needs to be provided between eyes and the display panel. Since part of the screen is enlarged by the lens, low resolution of the display panel might cause a problem of weak sense of reality and immersion.

The display panel is also required to have high color reproducibility. In particular, when using the display panel with high color reproducibility, the above-described device for VR or AR can perform display with colors that are as close to the actual object color as possible, leading to higher sense of reality and immersion.

An object of one embodiment of the present invention is to provide a display device with extremely high resolution. An object of one embodiment of the present invention is to provide a display device in which high color reproducibility is achieved. An object of one embodiment of the present invention is to provide a display device with both high resolution and high color reproducibility. Another object of one embodiment of the present invention is to provide a manufacturing method of the above-described display device.

Note that the descriptions of these objects do not disturb the existence of other objects. One embodiment of the present invention does not have to achieve all the objects. Note that objects other than these can be derived from the descriptions of the specification, the drawings, the claims, and the like.

Means for Solving the Problems

One embodiment of the present invention is a display device including a first light-emitting element, a second light-emitting element, a first insulating layer, a first optical adjustment layer, and a second optical adjustment layer. In each of the first light-emitting element and the second light-emitting element, a lower electrode having a light-transmitting property, a light-emitting layer, and an upper electrode having a semi-transmissive property and a semi-reflective property are stacked in this order. At least top surfaces of the first optical adjustment layer and the second optical adjustment layer each have a function of reflecting visible light. The first optical adjustment layer is thinner than the second optical adjustment layer. The first insulating layer is provided to cover the first optical adjustment layer and the second optical adjustment layer and has a planarized top surface. The first light-emitting element overlaps with the first optical adjustment layer with the first insulating layer therebetween, and the second light-emitting element overlaps with the second optical adjustment layer with the first insulating layer therebetween.

Another embodiment of the present invention is a display device including a first light-emitting element, a second light-emitting element, a first insulating layer, a first optical adjustment layer, and a second optical adjustment layer. In each of the first light-emitting element and the second light-emitting element, a lower electrode having a light-transmitting property, a light-emitting layer, and an upper electrode having a semi-transmissive property and a semi-reflective property are stacked in this order. The first optical adjustment layer and the second optical adjustment layer are provided on the same plane. The first insulating layer is provided to cover the first optical adjustment layer and the second optical adjustment layer, and includes a first portion overlapping with the first optical adjustment layer and a second portion overlapping with the second optical adjustment layer. The first light-emitting element is provided over the first portion of the first insulating layer, and the second light-emitting element is provided over the second portion of the first insulating layer. At least top surfaces of the first optical adjustment layer and the second optical adjustment each have a function of reflecting visible light. The second optical adjustment layer is thicker than the first optical adjustment layer. The first insulating layer has a top surface subjected to planarization treatment, and the first portion is thicker than the second portion.

In the above, a third light-emitting element and a third optical adjustment layer are preferably included. In this case, it is preferable that at least a top surface of the third optical adjustment layer have a function of reflecting visible light, and the third optical adjustment layer be thicker than the first optical adjustment layer and the second optical adjustment layer. It is also preferable that the top surface of the third optical adjustment layer be substantially aligned with the top surface of the first insulating layer, and a lower electrode of the third light-emitting element be provided in contact with the top surface of the third optical adjustment layer.

Another embodiment of the present invention is a display device including a first light-emitting element, a second light-emitting element, a first insulating layer, a first optical adjustment layer, and a second optical adjustment layer. The first light-emitting element includes a first lower electrode having a light-transmitting property, a light-emitting layer, and an upper electrode having a semi-transmissive property and a semi-reflective property. The second light-emitting element includes a second lower electrode having a light-transmitting property, the light-emitting layer, and the upper electrode. The first optical adjustment layer and the second optical adjustment layer are provided on the same plane. The first insulating layer is provided to cover part of the first optical adjustment layer and part of the second optical adjustment layer, and includes a first opening overlapping with the first optical adjustment layer and a second opening overlapping with the second optical adjustment layer. The first lower electrode is embedded in the first opening, and the second lower electrode is embedded in the second opening. At least top surfaces of the first optical adjustment layer and the second optical adjustment layer each have a function of reflecting visible light. The second optical adjustment layer is thicker than the first optical adjustment layer. The first insulating layer, the first lower electrode, and the second lower electrode are subjected to planarization treatment to have substantially aligned top surfaces. The first lower electrode is thicker than the second lower electrode.

In the above, a third light-emitting element and a third optical adjustment layer are preferably included. In this case, the third light-emitting element preferably includes a third lower electrode having a light-transmitting property, the light-emitting layer, and the upper electrode. It is also preferable that at least a top surface of the third optical adjustment layer have a function of reflecting visible light, and the third optical adjustment layer be thicker than the first optical adjustment layer and the second optical adjustment layer. It is also preferable that the top surface of the third optical adjustment layer be substantially aligned with the top surface of the first insulating layer, and the third lower electrode be provided in contact with the top surface of the third optical adjustment layer.

Another embodiment of the present invention is a display device including a first light-emitting element, a second light-emitting element, a first insulating layer, a second insulating layer, a third insulating layer, a first optical adjustment layer, a second optical adjustment layer, a first conductive layer, and a second conductive layer. The first light-emitting element includes a first lower electrode having a light-transmitting property, a light-emitting layer, and an upper electrode having a semi-transmissive property and a semi-reflective property. The second light-emitting element includes a second lower electrode having a light-transmitting property, the light-emitting layer, and the upper electrode. The first optical adjustment layer and the second optical adjustment layer are provided on the same plane. The first insulating layer is provided to cover part of the first optical adjustment layer and part of the second optical adjustment layer, and includes a first opening overlapping with the first optical adjustment layer and a second opening overlapping with the second optical adjustment layer. The first conductive layer is provided in the first opening along a side surface of the first insulating layer and a top surface of the first optical adjustment layer. The second conductive layer is provided in the second opening along a side surface of the first insulating layer and a top surface of the second optical adjustment layer. The second insulating layer is embedded in the first opening with the first conductive layer therebetween. The third insulating layer is embedded in the second opening with the second conductive layer therebetween. The first lower electrode is provided over the first opening and is in contact with the first conductive layer in an outer edge portion of the first opening. The second lower electrode is provided over the second opening and is in contact with the second conductive layer in an outer edge portion of the second opening. The first conductive layer and the second conductive layer each have a function of reflecting visible light. The second optical adjustment layer is thicker than the first optical adjustment layer. The first insulating layer, the second insulating layer, and the third insulating layer are subjected to planarization treatment to have substantially aligned top surfaces. The second insulating layer is thicker than the third insulating layer.

In the above, it is preferable that the first optical adjustment layer include a first film, and a second film and a third film be stacked in this order in the second optical adjustment layer. In this case, the first film and the third film are preferably films having a function of reflecting visible light and formed by processing the same film.

In the above, it is preferable that the first optical adjustment layer have conductivity, and the first optical adjustment layer and the lower electrode be electrically connected to each other.

In the above, a circuit layer including a transistor and a fourth insulating layer over the circuit layer are preferably included. In this case, it is preferable that the first optical adjustment layer be provided over the fourth insulating layer, and the transistor and the first light-emitting element be electrically connected to each other. In this case, the transistor preferably includes a metal oxide having crystallinity or single crystal silicon in a semiconductor layer where a channel is formed.

In the above, a first circuit layer including a first transistor; a second circuit layer including a second transistor; a fourth insulating layer over the first circuit layer; and a fifth insulating layer between the first circuit layer and the second circuit layer are preferably included. In this case, it is preferable that the first optical adjustment layer be provided over the fourth insulating layer, and the first transistor and the first light-emitting element be electrically connected to each other. In this case, it is preferable that the first transistor include a metal oxide having crystallinity in a first semiconductor layer where a channel is formed, and the second transistor include a metal oxide having crystallinity or single crystal silicon in a second semiconductor layer where a channel is formed.

In the above, a plurality of the first light-emitting elements are preferably included. In this case, the first light-emitting elements are preferably arranged in a matrix with a resolution of 5000 ppi or more.

Another embodiment of the present invention is a method for fabricating a display device including a step of forming a first optical adjustment layer and a second optical adjustment layer with different thicknesses over a formation surface; a step of forming a first insulating layer to cover the first optical adjustment layer and the second optical adjustment layer; a step of performing planarization treatment on the first insulating layer to planarize a top surface; a step of forming a first lower electrode overlapping with the first optical adjustment layer and a second lower electrode overlapping with the second optical adjustment layer over the first insulating layer; and a step of forming a light-emitting layer over the first lower electrode and the second lower electrode, and an upper electrode over the light-emitting element. The first optical adjustment layer and the second optical adjustment layer are formed so that at least top surfaces reflect visible light. The first lower electrode and the second lower electrode are formed to transmit visible light, and the upper electrode is formed to have a semi-transmissive property and a semi-reflective property.

Effect of the Invention

According to one embodiment of the present invention, a display device with extremely high resolution can be provided. Alternatively, a display device in which high color reproducibility is achieved can be provided. Alternatively, a display device with both high resolution and high color reproducibility can be provided.

Note that the descriptions of the effects do not disturb the existence of other effects. Note that one embodiment of the present invention does not need to have all these effects. Note that effects other than these can be derived from the descriptions of the specification, the drawings, the claims, and the like.

MODE FOR CARRYING OUT THE INVENTION

Figure 1:
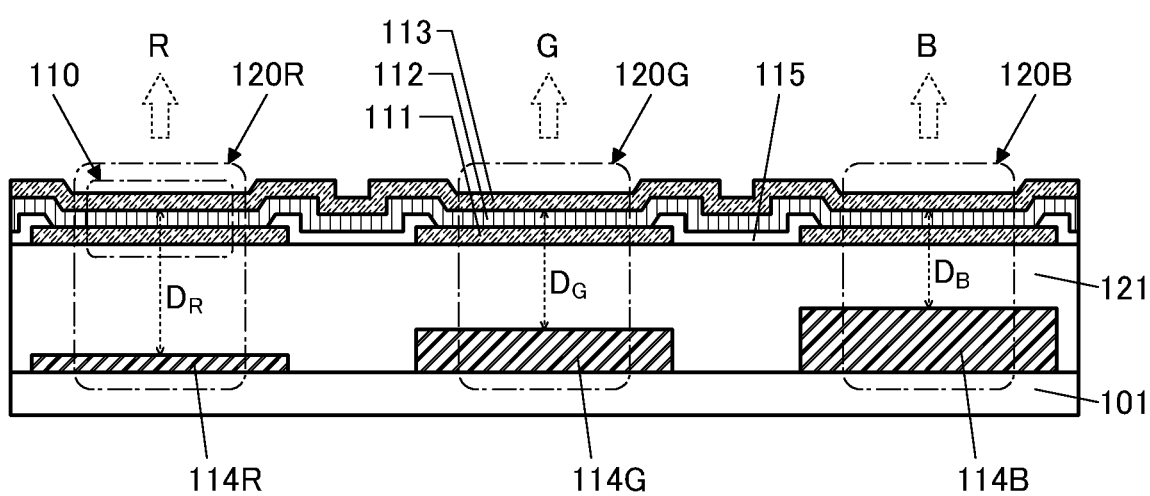
FIG. 1 A structure example of a display device.

Hereinafter, embodiments will be described with reference to the drawings. Note that the embodiments can be implemented in many different modes, and it will be readily appreciated by those skilled in the art that modes and details of the embodiments can be changed in various ways without departing from the spirit and scope thereof. Thus, the present invention should not be interpreted as being limited to the following description of the embodiments.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacked order (formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

Moreover, in this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked body including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a display device of one embodiment of the present invention and a fabrication method of the display device will be described.

The display device of one embodiment of the present invention includes light-emitting units emitting light of different colors. The light-emitting unit includes at least one light-emitting element. The light-emitting element includes a lower electrode, an upper electrode, and a layer containing a light-emitting compound (also referred to as a light-emitting layer or an EL layer) therebetween. As the light-emitting element, an electroluminescent element such as an organic EL element or an inorganic EL element is preferably used. Alternatively, a light-emitting diode (LED) may be used.

The light-emitting unit also includes an insulating layer overlapping with the light-emitting element and a reflective layer (also referred to as an optical adjustment layer) reflecting visible light through the insulating layer. Furthermore, it is preferable that the light-emitting element use a conductive film transmitting visible light as the lower electrode on the reflective layer side, and use a conductive film having a semi-transmissive property and a semi-reflective property as the upper electrode. The light-emitting unit has what is called a microcavity structure and intensifies light with a specific wavelength.

Two light-emitting elements provided in two light-emitting units that emit light of different colors are preferably light-emitting elements that emit white light and have similar structures. In this case, a structure can be employed in which the light-emitting layer and the upper electrode are shared by the two light-emitting elements, and the lower electrodes of the elements are electrically insulated from each other. Furthermore, the two light-emitting units differ in distance between the light-emitting element and the reflective layer. Thus, light with different wavelengths can be intensified and emitted.

In one embodiment of the present invention, reflective layers with different thicknesses are formed, an insulating layer is formed to cover these reflective layers, and then the top surface of the insulating layer is subjected to planarization treatment, whereby the insulating layer having different thicknesses over the respective reflective layers can be obtained. After that, the light-emitting elements overlapping with the respective reflective layers are formed over the planarized top surface of the insulating layer, whereby the light-emitting units that intensify different colors due to different optical distances (optical path lengths) can be formed separately.

That is, the display device of one embodiment of the present invention has a structure in which the reflective layers having different thicknesses are provided over a formation surface and the insulating layer whose top surface is subjected to planarization treatment is provided to cover the reflective layers. In the structure, the light-emitting elements can be provided over the insulating layer in the regions overlapping with the respective reflective layers. By the planarization treatment on the top surface of the insulating layer, a distance between the formation surface of the reflective layers (or the bottom surfaces of the reflective layers) and the top surface of the insulating layer becomes constant regardless of the thicknesses of the reflective layers. Thus, as the reflective layer is thicker, the insulating layer over the reflective layer is thinner; similarly, as the reflective layer is thinner, the insulating layer thereover is thicker. Thus, the thickness of the insulating layer positioned between the light-emitting element and the reflective layer can be adjusted by changing the thickness of the reflective layer. The reflective layer included in one embodiment of the present invention has a function of adjusting the optical distance (optical path length) by its thickness, and thus can be referred to as the optical adjustment layer.

Since the two light-emitting units have different distances between the light-emitting layer and the reflective layer, the light-emitting units intensify and emit light with different wavelengths. The difference in optical distance (also referred to as optical path length) between the light-emitting units is determined by the difference in the thickness of the reflective layer. Thus, the optical distances of the two light-emitting units can be adjusted accurately, which enables high-yield fabrication of a display device with high display quality, which has not only high color reproducibility but also reduced color unevenness between the light-emitting units.

In the light-emitting units exhibiting different colors, the light-emitting elements are each provided over the planarized top surface of the insulating layer. Thus, the light-emitting elements having the same structure are formed on the same plane within the light-emitting units emitting different colors, so that the level of a surface to which light is emitted (a light-emitting surface, specifically a top surface of the upper electrode) can be constant. This prevents a decrease in display quality due to different levels of the light-emitting surfaces, so that a display device with high color reproducibility and higher quality can be provided.

A structure may be employed in which one of the two light-emitting units does not include the insulating layer over the reflective layer. For example, the top surface of the insulating layer may be subjected to planarization treatment so that the top surface of the insulating layer and the top surface of the reflective layer are substantially aligned. When the planarization treatment for the insulating layer is performed in such a manner, the planarization treatment can be completed when the top surface of the reflective layer is exposed; thus, processing can be performed more accurately. In this case, a structure may be employed in which a layer containing a material different from that for the insulating layer and transmitting visible light is stacked over the reflective layer before the planarization treatment, and the top surface of the layer and the top surface of the insulating layer are substantially aligned after the planarization treatment. Thus, the top surface of the reflective layer is not exposed to the planarization treatment, so that a decrease in optical characteristics such as reflectance of the reflective layer can be prevented.

Furthermore, a structure may be employed in which an opening is provided in the insulating layer at a position overlapping with the reflective layer, and the lower electrode of the light-emitting element is embedded in the opening. In this case, planarization treatment is preferably performed so that the top surface of the insulating layer and the top surface of the lower electrode are substantially aligned. No step is generated in an end portion of the lower electrode in this case, so that the light-emitting layer and the upper electrode can be formed over a flat surface. Thus, the viewing angle characteristics, the aperture ratio, and the like can be improved.

In the display device of one embodiment of the present invention, the light-emitting units of different colors can be separately formed with extremely high accuracy. In addition, since no step is generated owing to the flat formation surface of the adjacent light-emitting elements, the light-emitting elements can be arranged at extremely high density. Thus, a display device with higher resolution than a conventional display device can be achieved. For example, the display device preferably has extremely high resolution in which pixels including one or more light-emitting elements (or light-emitting units) are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Although description is made here using mainly two light-emitting units for easy description, light-emitting units exhibiting three primary colors or four or more colors are preferably provided. Specifically, the light-emitting units emitting light of red (R), green (G), and blue (B) can be included. Alternatively, a light-emitting unit emitting light of yellow (Y), cyan (C), magenta (M), white (W), or the like may be provided in addition to or instead of the above.

More specific structure examples and a fabrication method example will be described below with reference to drawings.

Structure Example 1

FIG. 1 is a schematic cross-sectional view illustrating a display device of one embodiment of the present invention. The display device includes a light-emitting unit 120R, a light-emitting unit 120G, and a light-emitting unit 120B that exhibit different colors.

The light-emitting unit 120R, the light-emitting unit 120G, and the light-emitting unit 120B each include a light-emitting element 110. The light-emitting element 110 is provided over an insulating layer 121 having a light-transmitting property, and includes a conductive layer 111 functioning as a lower electrode, a conductive layer 113 functioning as an upper electrode, and an EL layer 112 that is sandwiched between the conductive layers and contains a light-emitting compound. The conductive layer 111 has a function of transmitting visible light, and the conductive layer 113 has a semi-transmissive property and a semi-reflective property with respect to visible light.

As the light-emitting element 110, it is possible to use an electroluminescent element having a function of emitting light in accordance with current flowing into the EL layer 112 when a potential difference is applied between the conductive layer 111 and the conductive layer 113. In particular, an organic EL element using a light-emitting organic compound is preferably used for the EL layer. In addition, the light-emitting element 110 is preferably an element emitting white light, which has two or more peaks in the visible light region of the emission spectrum.

Here, the EL layer 112 and the conductive layer 113 are provided in common for the light-emitting elements 110 provided in each of the light-emitting units. The conductive layer 113 functions as, for example, an electrode to which a common potential is applied. A potential for controlling the amount of light emitted from the light-emitting element 110 is independently applied to the conductive layers 111 provided in the light-emitting elements 110. The conductive layers 111 function as pixel electrodes, for example.

In addition, in FIG. 1, an insulating layer 115 is provided to cover an end portion of the conductive layer 111. The insulating layer 115 has a function of preventing electrical short circuit between the conductive layer 111 and the conductive layer 113 because of a decrease in the thickness of the EL layer 112 due to a step in the end portion of the conductive layer 111. As illustrated in FIG. 1, for higher coverage with the EL layer 112, an end portion of the insulating layer 115 positioned over the conductive layer 111 preferably has a tapered shape.

The light-emitting unit 120R includes, in addition to the light-emitting element 110, a reflective layer 114R (also referred to as an optical adjustment layer) provided over a substrate 101, and part of the insulating layer 121 positioned between the light-emitting element 110 and the reflective layer 114R. Similarly, the light-emitting unit 120G includes the light-emitting element 110, a reflective layer 114G, and part of the insulating layer 121. The light-emitting unit 120B includes the light-emitting element 110, a reflective layer 114B, and part of the insulating layer 121.

A surface of the substrate 101 is the formation surface of the reflective layer 114R, the reflective layer 114G, the reflective layer 114B, and the like. The substrate 101 has at least an insulating flat surface. As described later, a circuit board including a transistor, a wiring, or the like can also be used as the substrate 101. Note that in the case of a display device employing a passive matrix method or a segment method, an insulating substrate such as a glass substrate can be used as the substrate 101.

The insulating layer 121 is provided to cover the reflective layer 114R, the reflective layer 114G, and the reflective layer 114B. A top surface of the insulating layer 121 is preferably subjected to planarization treatment to form a flat surface. In other words, processing is performed so that the top surface of the insulating layer 121 has substantially the same level regardless of the place. In addition, the processing is performed so that the distance between the insulating layer 121 and the formation surface of the reflective layer 114R and the like (the top surface of the substrate 101) is substantially constant regardless of the place.

Note that among the three reflective layers, the reflective layer 114R has the smallest thickness and the reflective layer 114B has the largest thickness. Thus, the insulating layer 121 positioned over the three reflective layers has the largest thickness in a portion overlapping with the reflective layer 114R and has the smallest thickness in a portion overlapping with the reflective layer 114B. Here, as illustrated in FIG. 1, when the distances between top surfaces of the reflective layers and the bottom surface of the conductive layer 113 (i.e., an interface between the conductive layer 113 and the EL layer 112) in the light-emitting units are referred to as a distance $D_R$, a distance $D_G$, and a distance $D_B$, the distance $D_R$ is the largest and the distance $D_B$ is the smallest. The difference between the distance $D_R$, the distance $D_G$, and the distance $D_B$ corresponds to the difference in optical distance (optical path length) in the light-emitting units.

The light-emitting unit 120R has the longest optical path length among the three light-emitting units, and thus emits light R that is the intensified light with the longest wavelength. In contrast, the light-emitting unit 120B has the shortest optical path length, and thus emits light B that is the intensified light with the shortest wavelength. The light-emitting unit 120G emits light G that is the intensified light with the intermediate wavelength. For example, the light R is the intensified red light, the light G is the intensified green light, and the light B is the intensified blue light.

With such a structure, the light-emitting elements 110 need not be formed separately for different colors of the light-emitting units; thus, color display with high color reproducibility can be performed using elements with the same structure. Furthermore, since the EL layer 112 included in the light-emitting elements 110 need not be formed separately, the light-emitting elements 110 can be arranged at extremely high density. For example, a display device having resolution exceeding 5000 ppi can be achieved.

Structure Example 2

Structure examples of display devices provided with a substrate including a circuit element are described below.

Structure Example 2-1

Figure 2A:
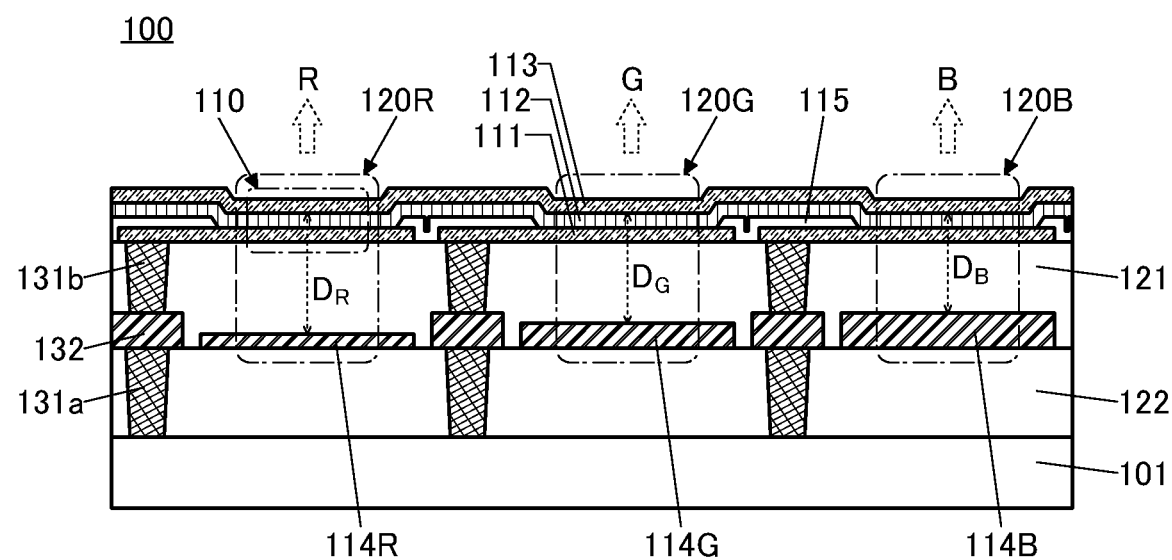
FIGS. 2A and 2B Structure examples of a display devices.

FIG. 2(A) is a schematic cross-sectional view of a display device 100. The display device 100 includes, over the substrate 101 provided with a semiconductor circuit, the light-emitting unit 120R, the light-emitting unit 120G, and the light-emitting unit 120B that are described in Structure Example 1.

The substrate 101 is a substrate provided with a circuit for driving the light-emitting units (also referred to as a pixel circuit) and a semiconductor circuit functioning as a driver circuit for driving the pixel circuit. More specific structure examples of the substrate 101 will be described later.

An insulating layer 122 is included between the substrate 101 and the insulating layer 121. A top surface of the insulating layer 122 is the formation surface of the reflective layer 114R, the reflective layer 114G, and the reflective layer 114B. The top surface of the insulating layer 122 is preferably flat.

The substrate 101 and the conductive layer 111 of the light-emitting element 110 are electrically connected to each other through a plug 131a, a conductive layer 132, and a plug 131b. The plug 131a is formed to be embedded in an opening provided in the insulating layer 122. The conductive layer 132 is provided over the insulating layer 122. In addition, the plug 131b is formed to be embedded in an opening that is provided in the insulating layer 121 to reach the conductive layer 132. The conductive layer 111 is provided in contact with a top surface of the plug 131b.

FIG. 2(A) illustrates an example in which the conductive layer 132 is formed by processing the same film as that for the reflective layer 114B. Note that without limitation to this, the conductive layer 132 may be formed by processing the same film as that for the reflective layer 114R or the reflective layer 114G. Alternatively, the conductive layer 132 may be formed by stacking the same films as that for two or more of the reflective layer 114R, the reflective layer 114G, and the reflective layer 114B.

In addition, FIG. 2(A) illustrates an example in which the reflective layer 114R, the reflective layer 114G, and the reflective layer 114B are not electrically connected to the substrate 101 and the conductive layer 111. For example, the reflective layer 114R, the reflective layer 114G, and the reflective layer 114B are electrically floating. Note that the reflective layer 114R, the reflective layer 114G, and the reflective layer 114B may be electrically connected to the conductive layer 132 to have the same potential as the conductive layer 111. Alternatively, a structure may be employed in which plugs that electrically connect the substrate 101 and each of the reflective layer 114R, the reflective layer 114G, and the reflective layer 114B are provided in the insulating layer 122 to apply a constant potential.

Structure Example 2-2

Figure 2B:
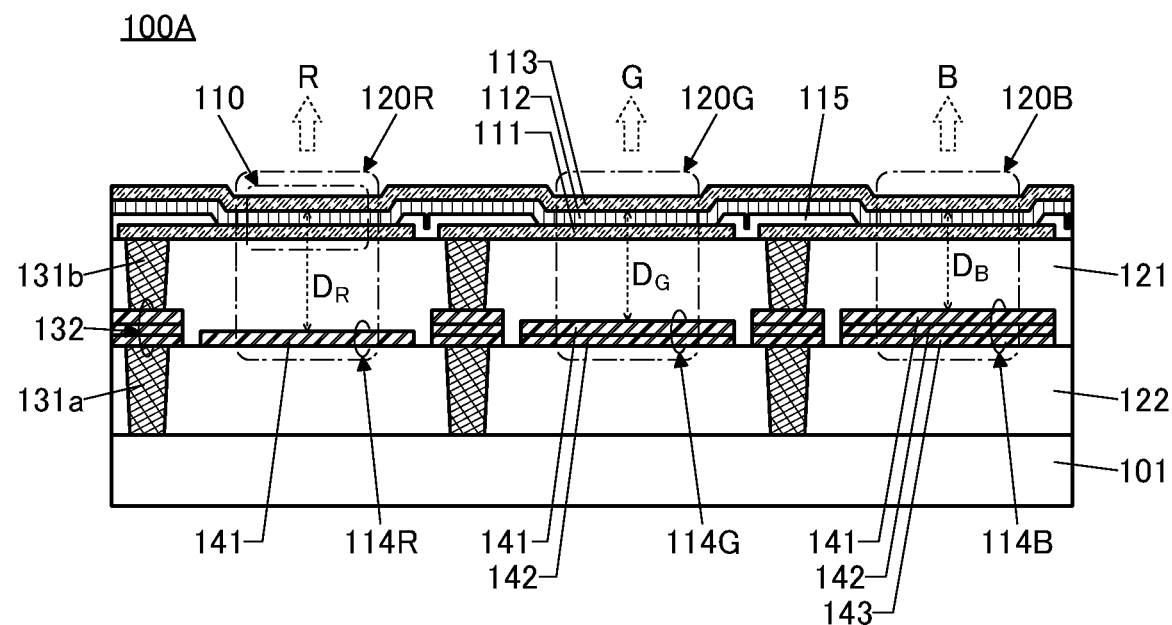

FIG. 2(B) is a schematic cross-sectional view of a display device 100A. The display device 100A is different from the display device 100 mainly in the structures of the reflective layer 114G and the reflective layer 114B.

The reflective layer 114B has a stacked-layer structure in which a conductive layer 141, a conductive layer 142, and a conductive layer 143 are stacked in this order from the light-emitting element 110 side. The reflective layer 114G has a stacked-layer structure in which the conductive layer 141 and the conductive layer 142 are stacked in this order from the light-emitting element 110 side. The reflective layer 114R is formed of the conductive layer 141.

A material with high reflectance with respect to visible light is preferably used for the conductive layer 141, among the conductive layer 141, the conductive layer 142, and the conductive layer 143. Although a material with lower reflectance than that for the conductive layer 141 may be used for the conductive layer 142 and the conductive layer 143, the same material is preferably used because a processing apparatus can be shared.

In the example illustrated in FIG. 2(B), the conductive layer 132 has the same stacked-layer structure as the reflective layer 114B.

Note that the conductive layer 142 and the conductive layer 143 do not necessarily have a conducting property, and layers formed of an insulating film or a semiconductor film may be used instead of the conductive layers. In that case, only a layer having conductivity (e.g., the conductive layer 141) can be used as the conductive layer 132. Alternatively, a structure in which the plug 131a and the plug 131b are in contact with each other without the conductive layer 132 or a structure in which the conductive layer 111 and the substrate 101 are connected through one plug may be employed.

[Components]
{Light-Emitting Element and Light-Emitting Unit}

As a light-emitting element that can be used as the light-emitting element 110, a self-luminous element can be used, and an element whose luminance is controlled by current or voltage is included in the category. For example, an LED, an organic EL element, an inorganic EL element, or the like can be used. In particular, an organic EL element is preferably used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which no light is extracted.

In one embodiment of the present invention, a top-emission light-emitting element in which light is emitted to the opposite side of the formation surface or a dual-emission light-emitting element can be particularly suitably used.

The EL layer 112 includes at least a light-emitting layer. In addition to the light-emitting layer, the EL layer 112 may further include layers containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 112, and an inorganic compound may also be contained. The layers that constitute the EL layer 112 can each be formed by a method such as an evaporation method (including a vacuum evaporation method), a transfer method, a printing method, an inkjet method, or a coating method.

When a voltage higher than the threshold voltage of the light-emitting element 110 is applied between a cathode and an anode, holes are injected to the EL layer 112 from the anode side and electrons are injected to the EL layer 112 from the cathode side. The injected electrons and holes are recombined in the EL layer 112 and a light-emitting substance contained in the EL layer 112 emits light.

In the case where a light-emitting element emitting white light is used as the light-emitting element 110, the EL layer 112 preferably contains two or more kinds of light-emitting substances. A white emission can be obtained by selecting light-emitting substances so that two or more light-emitting substances emit light of complementary colors, for example. For example, it is preferable to contain two or more out of light-emitting substances emitting light of red (R), green (G), blue (B), yellow (Y), orange (O), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material having a peak in a yellow wavelength range preferably has spectral components also in green and red wavelength ranges.

The EL layer 112 preferably has a structure in which a light-emitting layer containing a light-emitting material emitting light of one color and a light-emitting layer containing a light-emitting material emitting light of another color are stacked. For example, the plurality of light-emitting layers in the EL layer 112 may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the fabrication of the light-emitting element and reduces the drive voltage.

The light-emitting element 110 may be a single element including one EL layer or a tandem element in which a plurality of EL layers are stacked with a charge generation layer therebetween.

The conductive film that can be used for the conductive layer 111 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. A stacked-layer film of any of the above materials can be used for the conductive layers. For example, a stacked-layer film of indium tin oxide and an alloy of silver and magnesium is preferably used, in which case conductivity can be increased. Further alternatively, graphene or the like may be used.

For the conductive film reflecting visible light that can be used for the reflective layers, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation can be inhibited. Examples of a material for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

As the conductive film having a semi-transmissive property and a semi-reflective property that can be used for the conductive layer 113, the conductive film reflecting visible light formed to be thin enough to transmit visible light can be used. In addition, with the stacked-layer structure of the conductive film and the conductive film transmitting visible light, the conductivity and the mechanical strength can be increased. Furthermore, a conductive metal oxide film is preferably stacked over the conductive film reflecting visible light, in which case oxidization and corrosion of the conductive film reflecting visible light can be inhibited.

The conductive film having a semi-transmissive property and a semi-reflective property preferably has a reflectance with respect to visible light (e.g., the reflectance with respect to light having a specific wavelength within the range of 400 nm to 700 nm) of higher than or equal to 20% and lower than or equal to 80%, preferably higher than or equal to 40% and lower than or equal to 70%. The conductive film having reflectivity preferably has a reflectance with respect to visible light of higher than or equal to 40% and lower than or equal to 100%, further preferably higher than or equal to 70% and lower than or equal to 100%. The conductive film having light-transmitting property preferably has a reflectance with respect to visible light of higher than or equal to 0% and lower than or equal to 40%, further preferably higher than or equal to 0% and lower than or equal to 30%.

The electrodes included in the light-emitting elements and the light-emitting units may each be formed by an evaporation method or a sputtering method. Alternatively, a discharging method such as an inkjet method, a printing method such as a screen printing method, or a plating method may be used for the formation.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

For the reflective layer included in each of the light-emitting units, the conductive film reflecting visible light is preferably used at least in a portion positioned on the side closest to the light-emitting element 110.

In each of the light-emitting units, the optical distance between the surface of the reflective layer reflecting visible light and the conductive layer having a semi-transmissive property and a semi-reflective property with respect to visible light is preferably adjusted to be $m\lambda/2$ (m is a natural number) or in the vicinity thereof with respect to wavelength $\lambda$ of light to be intensified.

To be exact, the above-described optical distance depends on a product of the physical distance between the reflective surface of the reflective layer and the reflective surface of the conductive layer having a semi-transmissive property and a semi-reflective property and the refractive index of a layer provided therebetween, and thus is difficult to adjust exactly. Thus, it is preferable to adjust the optical distance on the assumption that the surface of the reflective layer and the surface of the conductive layer having a semi-transmissive property and a semi-reflective property are each the reflective surface.

In each of the light-emitting units, a material with high transmitting property with respect to visible light is preferably used for the insulating layer 121 positioned between the reflective layer and the conductive layer 111. For example, a single layer or stacked layers of an inorganic insulating film such as a silicon oxide film, a silicon oxynitride film, an aluminum oxide film, or a hafnium oxide film can be used. Using a material with a high refractive index (e.g., 1.4 or higher, preferably 1.5 or higher) for the insulating layer 121 can reduce the physical thickness and can increase the productivity.

Fabrication Method Example

An example of a fabrication method of the display device of one embodiment of the present invention will be described with reference to drawings. Description is made below using the display device 100A described in Structure Example 2 as an example.

Note that thin films that form the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

Alternatively, thin films that form the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, and a knife coater.

When the thin films that form the display device are processed, a photolithography method or the like can be used. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, and the thin film is processed by etching or the like, so that the resist mask is removed. In the other method, after a photosensitive thin film is formed, exposure and development are performed, so that the thin film is processed into a desired shape.

For light for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultraviolet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is unnecessary.

For etching of the thin film, a dry etching method, a wet etching method, a sandblast method, or the like can be used.

[Preparation for Substrate 101]

As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate or the like can be used. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

In this embodiment, a substrate including at least a pixel circuit is used as the substrate 101.

[Formation of Insulating Layer 122 and Plug 131*a*]

Figure 3A:
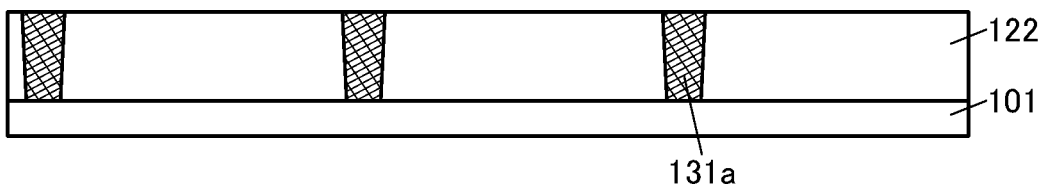
FIGS. 3A to 3E Diagrams showing an example of a fabrication method of a display device.
Figure 3B:
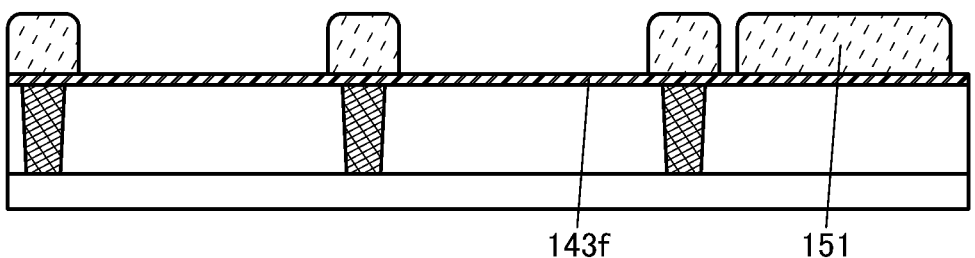

An insulating film to be the insulating layer 122 is formed over the substrate 101. Next, an opening reaching the substrate 101 is formed in the insulating layer 122 in a position where the plug 131*a* is to be formed. The opening is preferably an opening reaching an electrode or a wiring provided in the substrate 101. Then, a conductive film is formed to fill the opening and planarization treatment is performed to expose a top surface of the insulating layer 122. In this manner, the plug 131*a* embedded in the insulating layer 122 can be formed (FIG. 3(A)).

For the planarization treatment, a polishing method such as a chemical mechanical polishing (CMP) method or the like can be suitably used. Alternatively, dry etching treatment or plasma treatment may be used. Note that, polishing treatment, dry etching treatment, or plasma treatment may be performed a plurality of times, or these treatments may be performed in combination. In the case where the treatments are performed in combination, the order of steps is not particularly limited and may be set as appropriate depending on the roughness of the surface to be processed.

[Formation of Reflective Layer 114R, Reflective Layer 114G, Reflective Layer 114B, and Conductive Layer 132]

First, a conductive film 143*f* to be the conductive layer 143 is formed over the insulating layer 122. Next, a resist mask 151 is formed over the conductive film 143*f* (FIG.

3(B)). The resist mask 151 is formed in a portion to be the reflective layer 114B later. Furthermore, the resist mask 151 is formed also in a portion covering a top surface of the plug 131a. After that, the conductive film 143f not covered with the resist mask 151 is removed by etching, whereby the conductive layer 143 can be formed. After that, the resist mask 151 is removed.

Next, a conductive film 142f to be the conductive layer 142 later is formed to cover the insulating layer 122 and the conductive layer 143, and a resist mask 152 is formed over the conductive film 142f (FIG. 3(C)). The resist mask 152 is provided to cover a portion of the conductive film 142f overlapping with the conductive layer 143 (including a portion to be the conductive layer 132) and a portion to be the reflective layer 114G later. After that, the conductive film 142f is etched in a manner similar to the above, whereby the conductive layer 142 can be formed.

Next, a conductive film 141f to be the conductive layer 141 later is formed to cover the insulating layer 122 and the conductive layer 142, and a resist mask 153 is formed over the conductive film 141f (FIG. 3(D)). The resist mask 153 is provided to cover a portion of the conductive film 141f overlapping with the conductive layer 142 and a portion to be the reflective layer 114R later. After that, the conductive film 141f is etched in a manner similar to the above, whereby the conductive layer 141 can be formed.

Figure 3C:
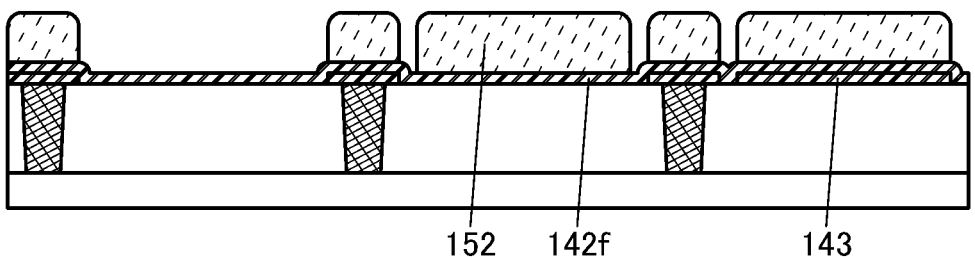
Figure 3D:
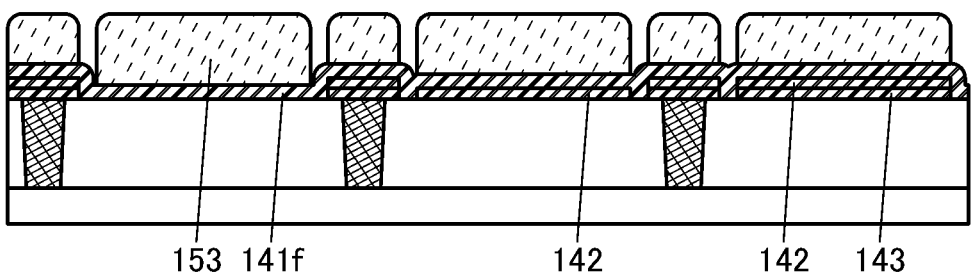
Figure 3E:
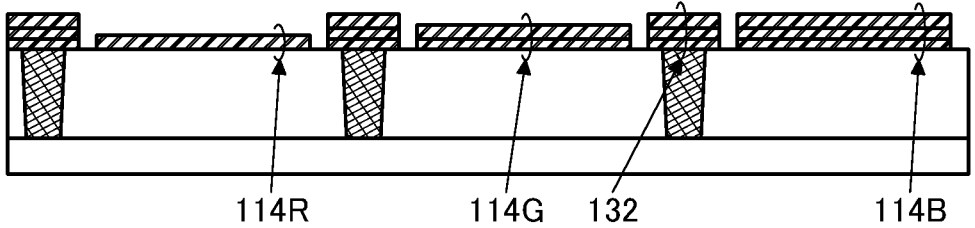

Through the above steps, the reflective layer 114R, the reflective layer 114G, the reflective layer 114B, and the conductive layer 132 can be formed (FIG. 3(E)).

Note that in the case where insulating films are used instead of the conductive film 143f and the conductive film 142f, a structure is employed in which the resist mask 151 and the resist mask 152 are not provided in a portion to be the conductive layer 132 so that the insulating films are not formed in the portion to be the conductive layer 132.

Note that although the resist mask 152 is formed so that an end portion of the resist mask 152 and an end portion of the conductive layer 143 are aligned in FIG. 3(C), these need not be aligned exactly. The resist mask 152 may be formed to cover the end portion of the conductive layer 143. In that case, the conductive layer 142 to be formed has a shape covering the end portion of the conductive layer 143. Note that the same applies to the positional relationship between the resist mask 153 and the conductive layer 142.

[Formation of Insulating Layer 121 and Plug 131b]

Figure 4A:
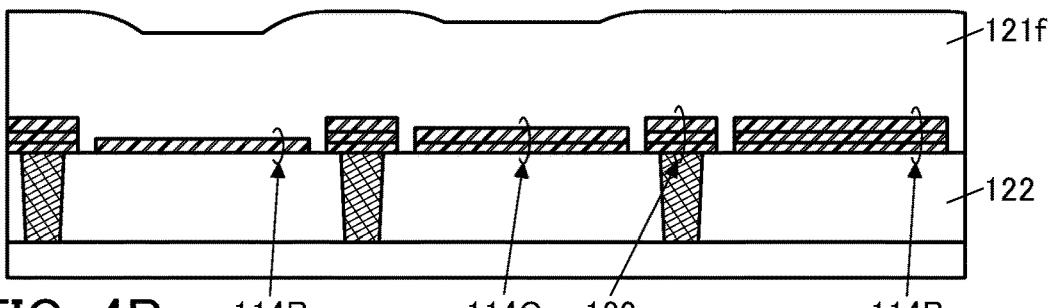
FIGS. 4A to 4E Diagrams showing an example of a fabrication method of a display device.

An insulating film 121f to be the insulating layer 121 later is formed over the insulating layer 122 to cover the reflective layer 114R, the reflective layer 114G, the reflective layer 114B, and the conductive layer 132 (FIG. 4(A)).

Figure 4B:
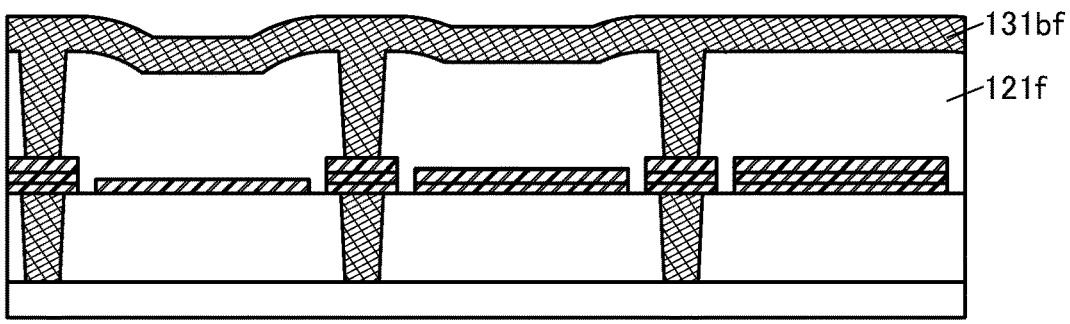

Next, an opening reaching the conductive layer 132 is formed in the insulating film 121f, and a conductive film 131bf to be the plug 131b later is formed to fill the opening (FIG. 4(B)).

Figure 4C:
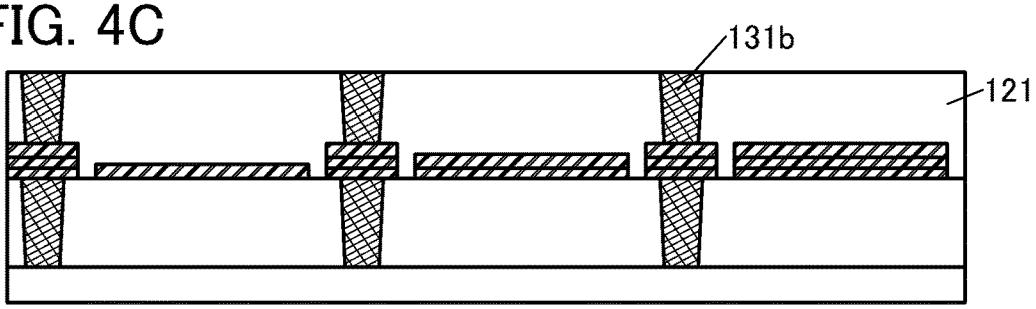

After that, planarization treatment is performed until a top surface of the insulating film 121f is exposed and the insulating film 121f over the reflective layer 114B has a desired thickness, whereby the insulating layer 121 having a planarized top surface and the plug 131b embedded in the insulating layer 121 can be formed (FIG. 4(C)).

The thickness of the insulating film 121f at least in a portion overlapping with the reflective layer 114B is larger than the thickness of the insulating layer 121 that is to be formed after the planarization treatment. At this time, due to uneven shape of the top surface of the insulating film 121f, part of the conductive film 131bf might remain over the top surface of the insulating film 121f after the planarization treatment. Thus, the insulating film 121f is formed to have enough thickness in advance, and additional planarization treatment is performed after the top surface of the insulating film 121f is exposed in the planarization treatment, whereby the remaining film of the conductive layer 131bf can be suitably removed.

In the planarization treatment, accurate processing is preferably performed so that a portion of the insulating layer 121 overlapping with the reflective layer 114B has a desired thickness. For example, in the case of using a CMP method, polishing is performed first at a constant processing rate until the top surface of the insulating film 121f is partly exposed. After that, polishing is performed under a condition with a lower processing rate until the insulating film 121f has a desired thickness, so that highly accurate processing can be performed.

Examples of a method for detecting the end of the polishing include an optical method in which the surface of the formation surface is irradiated with light and a change in the reflected light is detected; a physical method in which a change in the polishing resistance received by the processing apparatus from the formation surface is detected; and a method in which a magnetic line is applied to the formation surface and a change in the magnetic line due to the generated eddy current is used.

After the top surface of the insulating film 121f is exposed, polishing treatment is performed under a condition with a low processing rate while the thickness of the insulating film 121f is monitored by an optical method using a laser interferometer or the like, whereby the thickness of the insulating layer 121 can be controlled with high accuracy. Note that the polishing treatment may be performed a plurality of times until the insulating layer 121 has a desired thickness, as necessary.

[Formation of Conductive Layer 111]

A conductive film is formed over the insulating layer 121 and the plug 131b and an unnecessary portion is removed by etching, whereby the conductive layer 111 electrically connected to the plug 131b is formed.

[Formation of Insulating Layer 115]

Figure 4D:
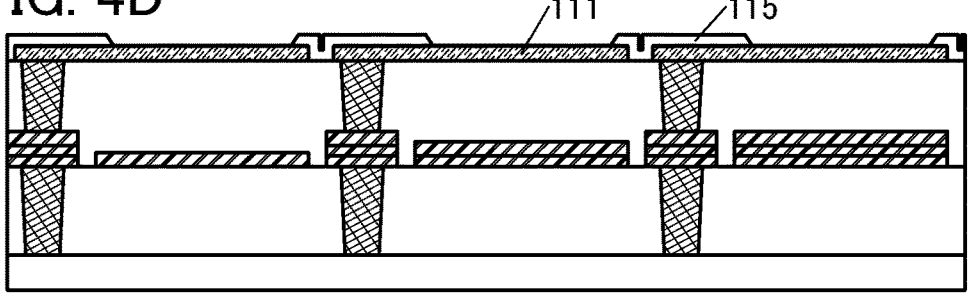

Next, an insulating film is formed to cover the conductive layer 111 and the insulating layer 121, and an unnecessary portion is removed by etching, whereby the insulating layer 115 covering the end portion of the conductive layer 111 is formed (FIG. 4(D)). The insulating layer 115 is processed to have an opening overlapping with the reflective layer 114R, the reflective layer 114G, or the reflective layer 114B in a region overlapping with the conductive layer 111.

In addition, the end portion of the insulating layer 115 over the conductive layer 111 is preferably processed into a tapered shape. The taper angle of the end portion of the insulating layer 115 (an angle between the formation surface and the end surface) is greater than 0° and less than or equal to 60°, preferably greater than or equal to 5° and less than or equal to 45°, further preferably greater than or equal to 5° and less than or equal to 30°.

The insulating layer 115 can be formed using an organic insulating film or an inorganic insulating film. In particular, in the case of a display device with ultra-high resolution (e.g., 2000 ppi or more), an inorganic insulating film is preferably used.

[Formation of EL Layer 112 and Conductive Layer 113]

Figure 4E:
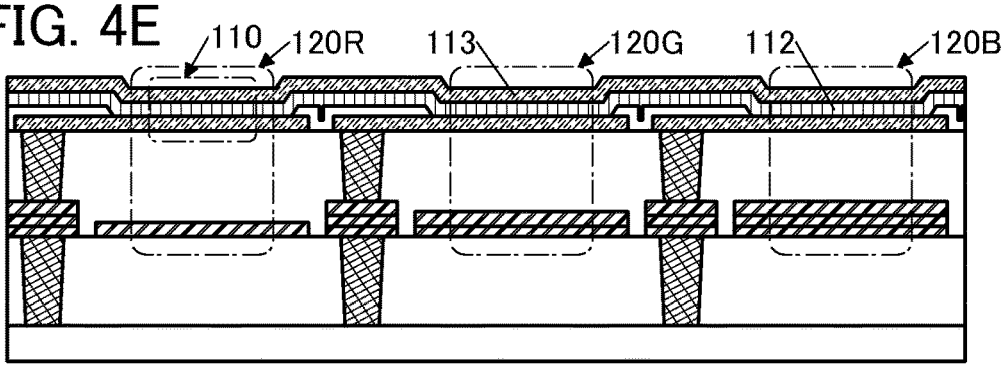

Next, the EL layer 112 and the conductive layer 113 are formed in this order over the conductive layer 111 and the insulating layer 115, whereby the light-emitting element 110 is formed (FIG. 4(E)).

The EL layer 112 includes at least a layer containing a light-emitting compound. A structure may be employed in which an electron-injection layer, an electron-transport layer, a charge-generation layer, a hole-transport layer, and a hole-injection layer are stacked in addition to the above. The EL layer 112 can be formed by, for example, a liquid phase method such as an evaporation method or an inkjet method.

The conductive layer 113 is formed to have a semi-transmissive property and a semi-reflective property with respect to visible light. For example, a metal film or an alloy film that is thin enough to transmit visible light can be used. Alternatively, a conductive film (e.g., a metal oxide film) may be stacked over such a film.

In the above manner, the light-emitting unit 120R, the light-emitting unit 120G, and the light-emitting unit 120B that have different optical distances can be formed.

According to the above fabrication method example, the difference in optical distance among the light-emitting units can be precisely controlled by the thicknesses of the reflective layers; thus, chromaticity deviation in the light-emitting units is unlikely to occur, so that a display device having excellent color reproducibility and extremely high display quality can be fabricated easily.

The light-emitting element 110 and the reflective layers can be formed over an insulating layer with a planarized top surface. Furthermore, the lower electrode (the conductive layer 111) of the light-emitting element 110 can be electrically connected to a pixel circuit or the like of the substrate 101 through a plug, so that an extremely minute pixel can be formed and accordingly a display device with extremely high resolution can be achieved. In addition, since the light-emitting element 110 can be placed to overlap with the pixel circuit or the driver circuit, a display device with a high aperture ratio (effective light-emitting area ratio) can be achieved.

Structure Example 3

A structure example of a display device whose structure is partly different from those of Structure Example 1 and Structure Example 2 will be described below.

Structure Example 3-1

Figure 5A:
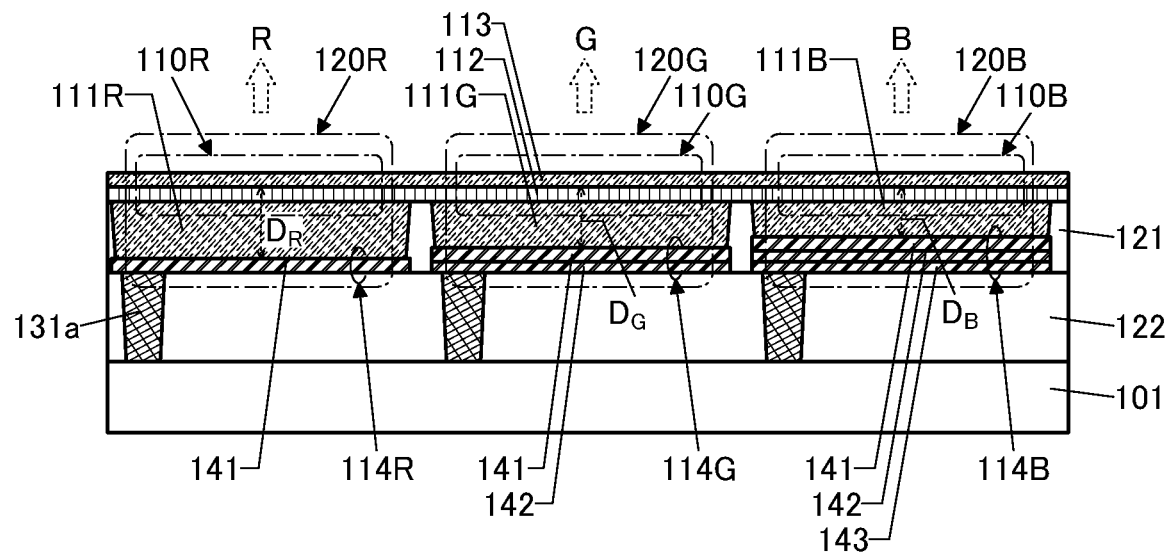
FIGS. 5A and 5B Structure examples of a display devices.

FIG. 5(A) is a schematic cross-sectional view of a display device 100B.

The light-emitting unit 120R included in the display device 100B includes the reflective layer 114R and a light-emitting element 110R. The light-emitting element 110R includes a conductive layer 111R, the EL layer 112, and the conductive layer 113.

The reflective layer 114R is electrically connected to the substrate 101 through the plug 131a. In addition, an opening reaching the reflective layer 114R is provided in the insulating layer 121 over the reflective layer 114R, and the conductive layer 111R is embedded in the opening. The top surface of the insulating layer 121 and a top surface of the conductive layer 111R are each planarized so that no large step is formed at the boundary therebetween. The EL layer 112 is provided in contact with the top surface of the conductive layer 111R and the top surface of the insulating layer 121 that are planarized, and the conductive layer 113 is provided over the EL layer 112. Since the formation surface of the EL layer 112 is planarized in this manner, a structure may be employed in which the insulating layer 115 described in the above structure example is not provided, leading to a higher aperture ratio.

Here, since the reflective layer 114R and the conductive layer 111R are electrically connected to each other in the display device 100B, a structure may be employed in which the conductive layer 132 and the plug 131b included in the display device 100A are not provided. Furthermore, since the top surface of the plug 131a is planarized, a region overlapping with the plug 131a can also be used as a light-emitting region of the light-emitting unit 120R, leading to a higher aperture ratio.

The light-emitting unit 120G includes a light-emitting element 110G and the reflective layer 114G. The light-emitting element 110G includes a conductive layer 111G, the EL layer 112, and the conductive layer 113. The light-emitting unit 120G is similar to the light-emitting unit 120R except for the structure of the reflective layer 114G and the thickness of the conductive layer 111G. In the reflective layer 114G, the conductive layer 141 and the conductive layer 142 are stacked. Since the top surface of the conductive layer 111G is planarized like the conductive layer 111R, the conductive layer 111G is formed to be thinner than the conductive layer 111R by the thickness of the conductive layer 142.

The light-emitting unit 120B includes a light-emitting element 110B and the reflective layer 114B. The light-emitting element 110B includes a conductive layer 111B, the EL layer 112, and the conductive layer 113. The light-emitting unit 120B is similar to the light-emitting unit 120R and the light-emitting unit 120G except for the structure of the reflective layer 114B and the thickness of the conductive layer 111B. In the reflective layer 114B, the conductive layer 141, the conductive layer 142, and the conductive layer 143 are stacked. Since the top surface of the conductive layer 111B is planarized like the conductive layer 111R and the like, the conductive layer 111B is formed to be thinner than the conductive layer 111G by the thickness of the conductive layer 143.

Structure Example 3-2

Figure 5B:
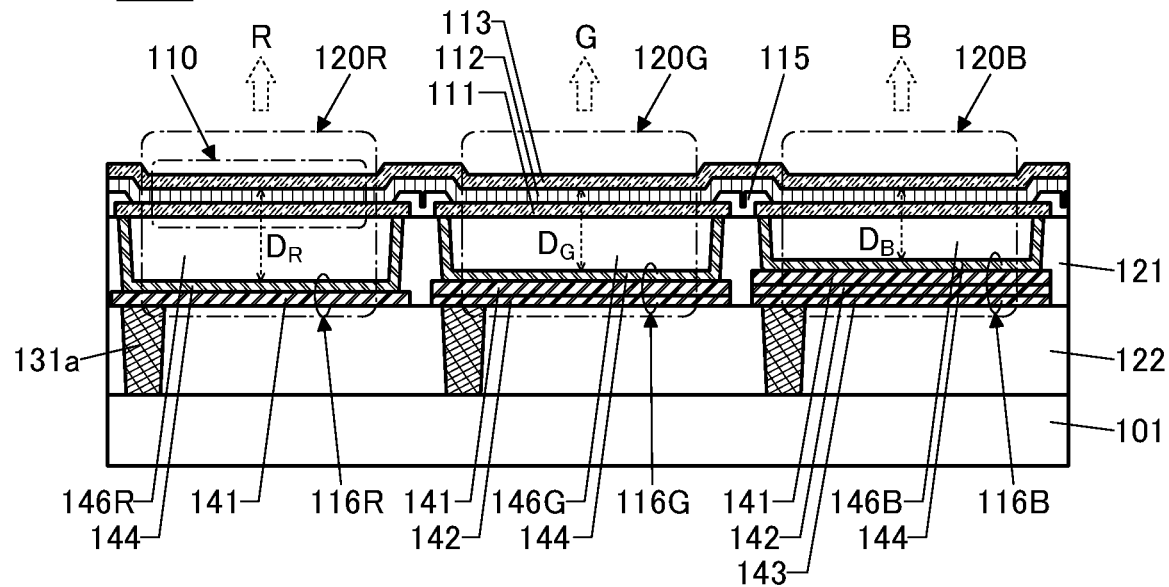

FIG. 5(B) is a schematic cross-sectional view of a display device 100C.

The light-emitting unit 120R included in the display device 100C includes the light-emitting element 110, a reflective layer 116R, and an insulating layer 146R. The reflective layer 116R includes the conductive layer 141 and a conductive layer 144.

The conductive layer 141 of the reflective layer 116R is provided over the insulating layer 122 and electrically connected to the plug 131a. An opening reaching the conductive layer 141 is provided in the insulating layer 121. The conductive layer 144 is provided in the opening of the insulating layer 121 and is provided along the top surface of the conductive layer 144 and a sidewall of the opening. In addition, the insulating layer 146R is provided to be embedded in a region that is in the opening of the insulating layer 121 and surrounded by the conductive layer 144. Top surfaces of the insulating layer 121, the insulating layer 146R, and the conductive layer 144 are each planarized.

The conductive layer 111 of the light-emitting element 110 included in the light-emitting unit 120R is provided in contact with the top surfaces of the insulating layer 121, the insulating layer 146R, and the conductive layer 144. That is, the conductive layer 144 and the conductive layer 111 are electrically connected to each other in an outer edge portion of the opening of the insulating layer 121. With such a structure, the substrate 101 and the conductive layer 111 can be electrically connected to each other through the plug 131a, the conductive layer 141, and the conductive layer 144. This enables a portion of the light-emitting unit 120R overlapping with the plug 131a to be used as a light-emitting region, leading to a higher aperture ratio.

The light-emitting unit 120G is different from the light-emitting unit 120R in including an insulating layer 146G and a reflective layer 116G instead of the insulating layer 146R and the reflective layer 116R. The reflective layer 116G includes the conductive layer 141, the conductive layer 142, and the conductive layer 144. The insulating layer 146G is processed to have a thickness smaller than the insulating layer 146R by the thickness of the conductive layer 142.

The light-emitting unit 120B is different from the light-emitting unit 120R in including an insulating layer 146B and a reflective layer 116G instead of the insulating layer 146R and the reflective layer 116R. The reflective layer 116G includes the conductive layer 141, the conductive layer 142, the conductive layer 143, and the conductive layer 144. The insulating layer 146B is processed to have a thickness smaller than the insulating layer 146R by the thicknesses of the conductive layer 142 and the conductive layer 143.

Structure Example 4

A structure example of a display device whose structure is partly different from those of the above structure examples will be described below.

Structure Example 4-1

Figure 6A:
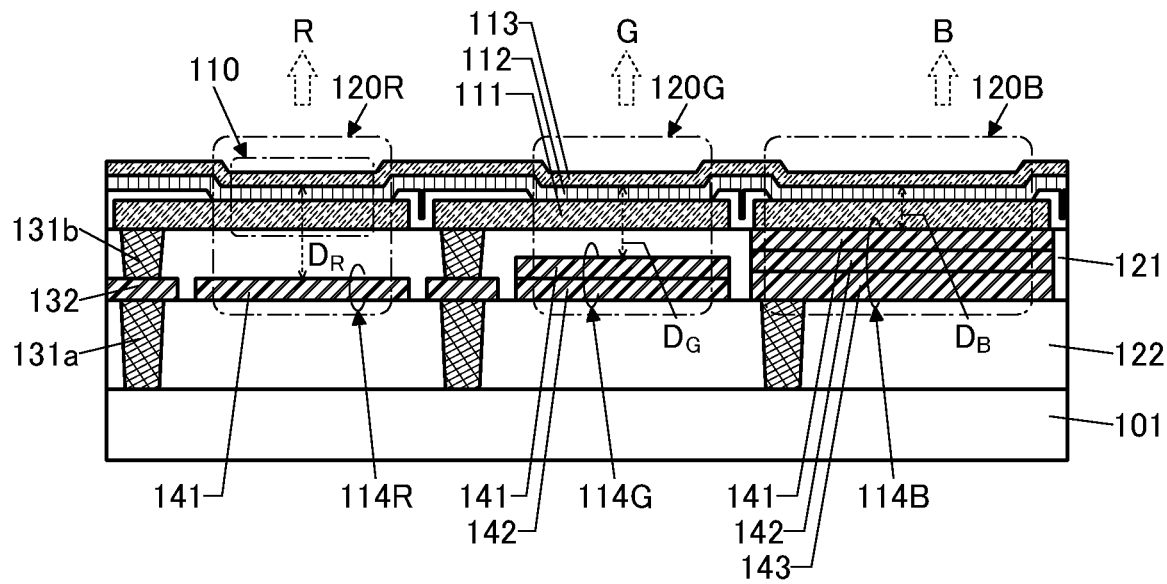
FIGS. 6A and 6B Structure example of a display devices.

FIG. 6(A) is a schematic cross-sectional view of a display device 100D. The display device 100D is different from the display device 100A mainly in the structure of the light-emitting unit 120B.

In the light-emitting unit 120B, the top surface of the conductive layer 141 and the top surface of the insulating layer 121 are positioned on substantially the same plane. In addition, the insulating layer 121 is not positioned between the conductive layer 111 and the conductive layer 141 and these conductive layers are provided in contact with each other; thus, the conductive layer 111 and the conductive layer 141 are electrically connected to each other.

The plug 131a provided in the light-emitting unit 120B is provided in contact with the conductive layer 143. The substrate 101 and the conductive layer 111 are electrically connected to each other through the plug 131a, the conductive layer 143, the conductive layer 142, and the conductive layer 141. Thus, the conductive layer 132 is not necessarily provided in the light-emitting unit 120B and the portion overlapping with the plug 131a can be used as the light-emitting region, leading to a higher aperture ratio. In particular, in the case where the light-emitting unit 120B is a light-emitting unit exhibiting blue, a light-emitting area emitting blue light with low luminosity factor can be made larger than light-emitting regions emitting the other colors, so that the display quality can be further increased and power consumption can be reduced.

In addition, with such a structure, a point of time when exposure of the conductive layer 141 is detected in the planarization treatment for the top surface of the insulating layer 121 can be the end of the planarization treatment. Thus, the thickness of the insulating layer 121 of the light-emitting unit 120R or the light-emitting unit 120G can be controlled accurately. Thus, chromaticity deviation due to optical distance deviation is unlikely to occur, leading to higher manufacturing yield.

The thicknesses of the conductive layers 111 can be the same in the light-emitting units. Since the display device 100D has a structure in which the insulating layer 121 is not provided between the conductive layer 111 and the reflective layer 114B in the light-emitting unit 120B, the conductive layer 111 is preferably formed to be thicker than that of the display device 100A described in Structure Example 2, for example. The thickness of the conductive layer 111 can be set in accordance with the optical distance of the light-emitting unit 120B.

Structure Example 4-2

Figure 6B:
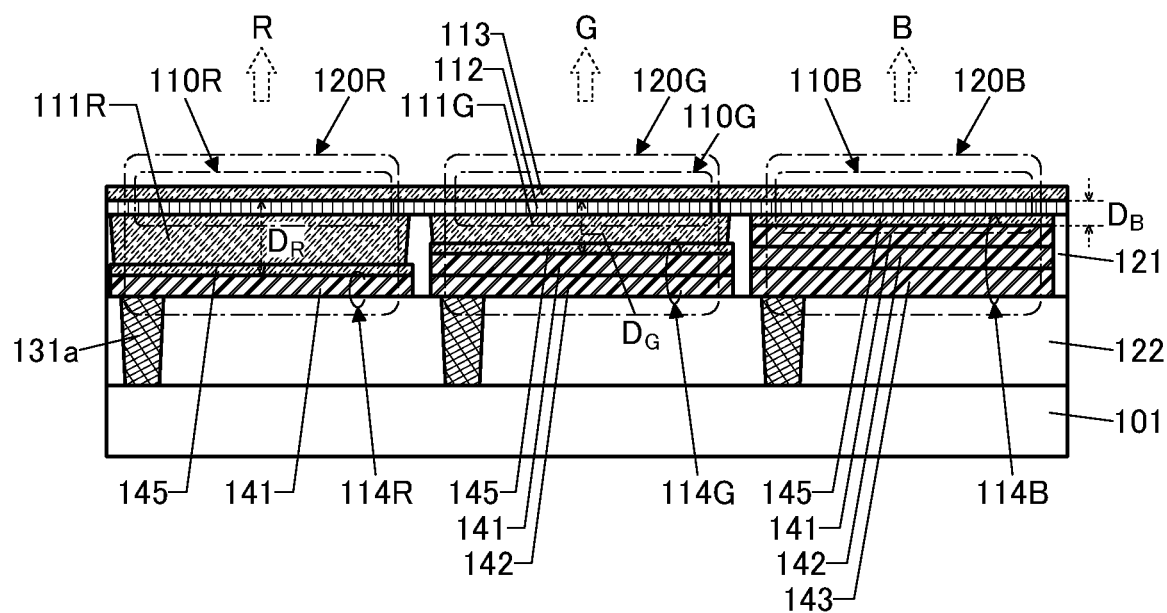

FIG. 6(B) is a schematic cross-sectional view of a display device 100E.

The light-emitting unit 120R includes the light-emitting element 110R, a conductive layer 145, and the reflective layer 114R. The light-emitting element 110R includes the conductive layer 111R, the EL layer 112, and the conductive layer 113.

The conductive layer 141 included in the reflective layer 114R is provided over the insulating layer 122 to be in contact with the plug 131a. The conductive layer 145 has a light-transmitting property and is provided over the conductive layer 141. The insulating layer 121 has an opening reaching the conductive layer 145. The conductive layer 111R is provided to be embedded in the opening of the insulating layer 121 to be in contact with the conductive layer 145. The top surface of the conductive layer 111R and the top surface of the insulating layer 121 are planarized so that no step is formed at the boundary therebetween. The substrate 101 and the conductive layer 111R are electrically connected to the plug 131a, the conductive layer 141, and the conductive layer 145. In the light-emitting unit 120R, a region overlapping with the plug 131a can also be used as a light-emitting region.

The light-emitting unit 120G includes the light-emitting element 110G, the conductive layer 145, and the reflective layer 114G. The light-emitting element 110G includes the conductive layer 111G, the EL layer 112, and the conductive layer 113. The light-emitting unit 120G has a structure similar to that of the light-emitting unit 120R except that the reflective layer 114G includes the conductive layer 141 and the conductive layer 142. The conductive layer 111G is formed to be thinner than the conductive layer 111R by the thickness of the conductive layer 142.

The light-emitting unit 120B includes the light-emitting element 110B, the conductive layer 145, and the reflective layer 114B. The light-emitting element 110B is different from the light-emitting element 110R and the light-emitting element 110G in not including a conductive layer corresponding to the conductive layer 111R or the conductive layer 111G. That is, the light-emitting element 110B includes the conductive layer 145 functioning as a lower electrode, the EL layer 112, and the conductive layer 113. In addition, in the light-emitting unit 120B, a top surface of the conductive layer 145 is provided to be positioned on substantially the same plane as the top surface of the insulating layer 121.

With such a structure, a point of time when exposure of the conductive layer 145 is detected in the planarization treatment for the top surface of the insulating layer 121 can be the end of the planarization treatment. Thus, the thickness of the conductive layer 111R included in the light-emitting unit 120R and the thickness of the conductive layer 111G included in the light-emitting unit 120B can be controlled accurately in the planarization treatment for the insulating layer 121.

When each light-emitting unit has a structure in which the conductive layer 145 having a light-emitting property covers the top surface of the conductive layer 141 that forms the reflective surface, the top surface of the conductive layer 141 can be prevented from being exposed to etching at the time of formation of the opening of the insulating layer 121 and to planarization treatment at the time of the planarization treatment. This can prevent a decrease in emission efficiency of the light-emitting units due to decreased reflectance caused by the quality change, corrosion, or the like of the top surface of the conductive layer 141. As the conductive layer 145, a conductive metal oxide film can be used, for example.

Structure Example 5

A more specific example of the display device including a transistor will be described below.

Structure Example 5-1

Figure 7:
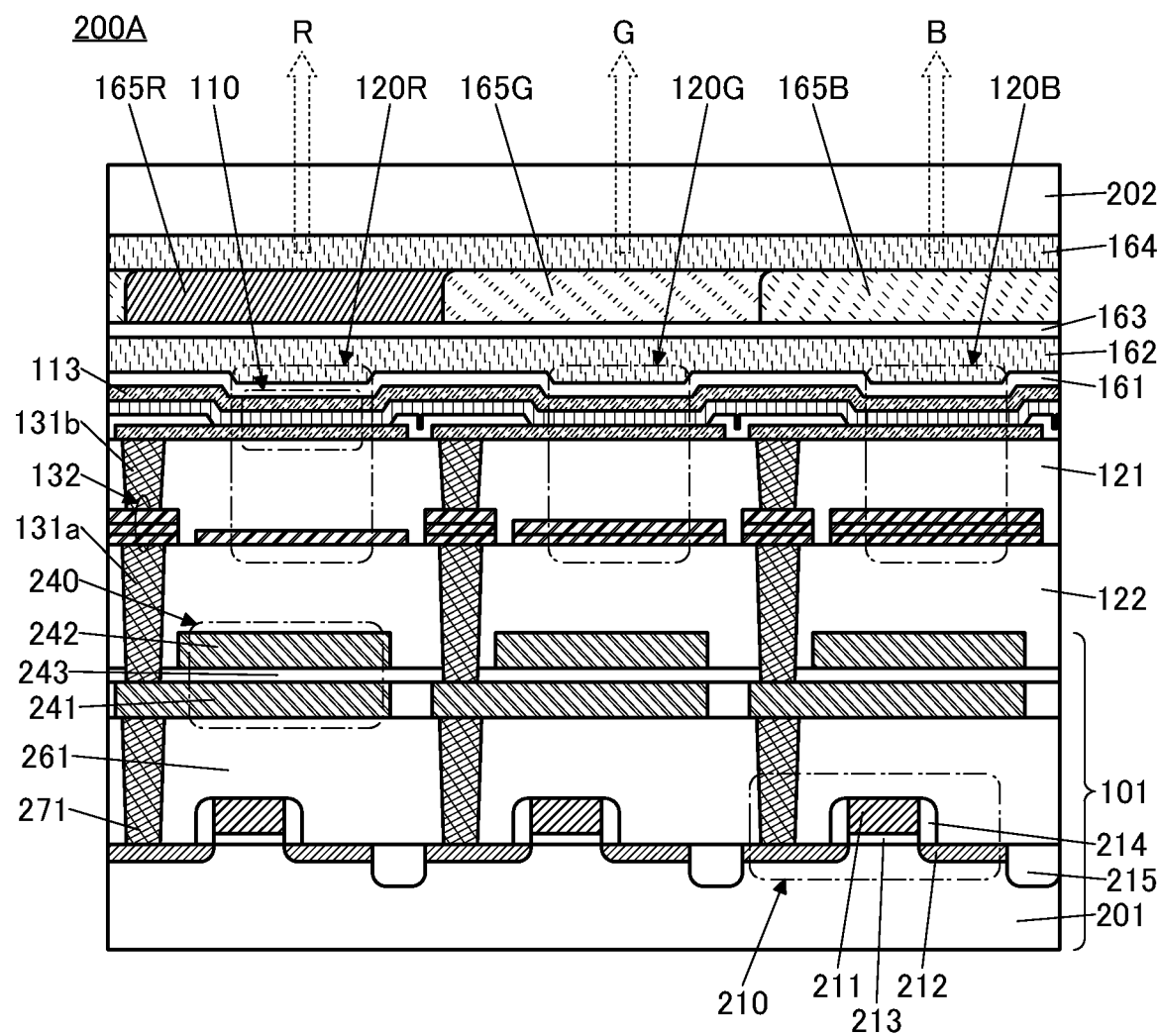
FIG. 7 A structure example of a display device.

FIG. 7 is a schematic cross-sectional view of a display device 200A.

The display device 200A includes the light-emitting unit 120R, the light-emitting unit 120G, the light-emitting unit 120B, a capacitor 240, a transistor 210, and the like.

The transistor 210 is a transistor whose channel region is formed in a substrate 201. As the substrate 201, a semiconductor substrate such as a single crystal silicon substrate can be used. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover a side surface of the conductive layer 211 and functions as a sidewall insulating layer.

In addition, an element isolation layer 215 is provided between two adjacent transistors 210 to be embedded in the substrate 201.

Furthermore, an insulating layer 261 is provided to cover the transistor 210, and the capacitor 240 is provided over the insulating layer 261.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

The conductive layer 241 is provided over the insulating layer 261 and is electrically connected to one of the source and the drain of the transistor 210 through a plug 271 embedded in the insulating layer 261. The insulating layer 243 is provided to cover the conductive layer 241. The conductive layer 242 is provided in a region overlapping with the conductive layer 241 with the insulating layer 243 therebetween.

The insulating layer 122 is provided to cover the capacitor 240, and the light-emitting unit 120R, the light-emitting unit 120G, the light-emitting unit 120B, the conductive layer 132, and the like are provided over the insulating layer 122.

In the example shown here, the structure described in Structure Example 2-2 with reference to FIG. 2(B) is used as the structures of the light-emitting unit 120R, the light-emitting unit 120G, the light-emitting unit 120B, and the conductive layer 132; however, there is no limitation and a variety of structures described above can be employed.

In the display device 200A, an insulating layer 161, an insulating layer 162, and an insulating layer 163 are provided to cover the conductive layer 113 of the light-emitting element 110. These three insulating layers each function as a protective layer that prevents diffusion of impurities such as water into the light-emitting element 110. As the insulating layer 161 and the insulating layer 163, it is preferable to use an inorganic insulating film with low moisture permeability, such as a silicon oxide film, a silicon nitride film, or an aluminum oxide film. As the insulating layer 162, an organic insulating film having a high light-transmitting property can be used. Using an organic insulating film as the insulating layer 162 can reduce the influence of uneven shape below the insulating layer 162, so that the formation surface of the insulating layer 163 can be a smooth surface. Accordingly, a defect such as a pinhole is unlikely to be generated in the insulating layer 163, leading to higher moisture permeability of the protective layer. Note that the structure of the protective layer covering the light-emitting element 110 is not limited thereto, and a single layer or a two-layer structure may be employed or a stacked-layer structure of four or more layers may be employed.

A coloring layer 165R overlapping with the light-emitting unit 120R, a coloring layer 165G overlapping with the light-emitting unit 120G, and a coloring layer 165B overlapping with the light-emitting unit 120B are provided over the insulating layer 163. For example, the coloring layer 165R transmits red light, the coloring layer 165G transmits green light, and the coloring layer 165B transmits blue light. This can increase the color purity of light from the light-emitting units, so that a display device with higher display quality can be achieved. Furthermore, forming the coloring layers over the insulating layer 163 makes it easier to align the light-emitting units and the coloring layers than the case where the coloring layers are formed on a substrate 202 (described later) side, so that a display device with extremely high resolution can be achieved.

The display device 200A includes the substrate 202 on the viewing side. The substrate 202 and the substrate 201 are bonded to each other with an adhesive layer 164. As the substrate 202, a substrate having a light-transmitting property such as a glass substrate, a quartz substrate, a sapphire substrate, or a plastic substrate can be used.

With such a structure, a display device with extremely high resolution and high display quality can be achieved.

Modification Example of Structure Example 5-1

Figure 8:
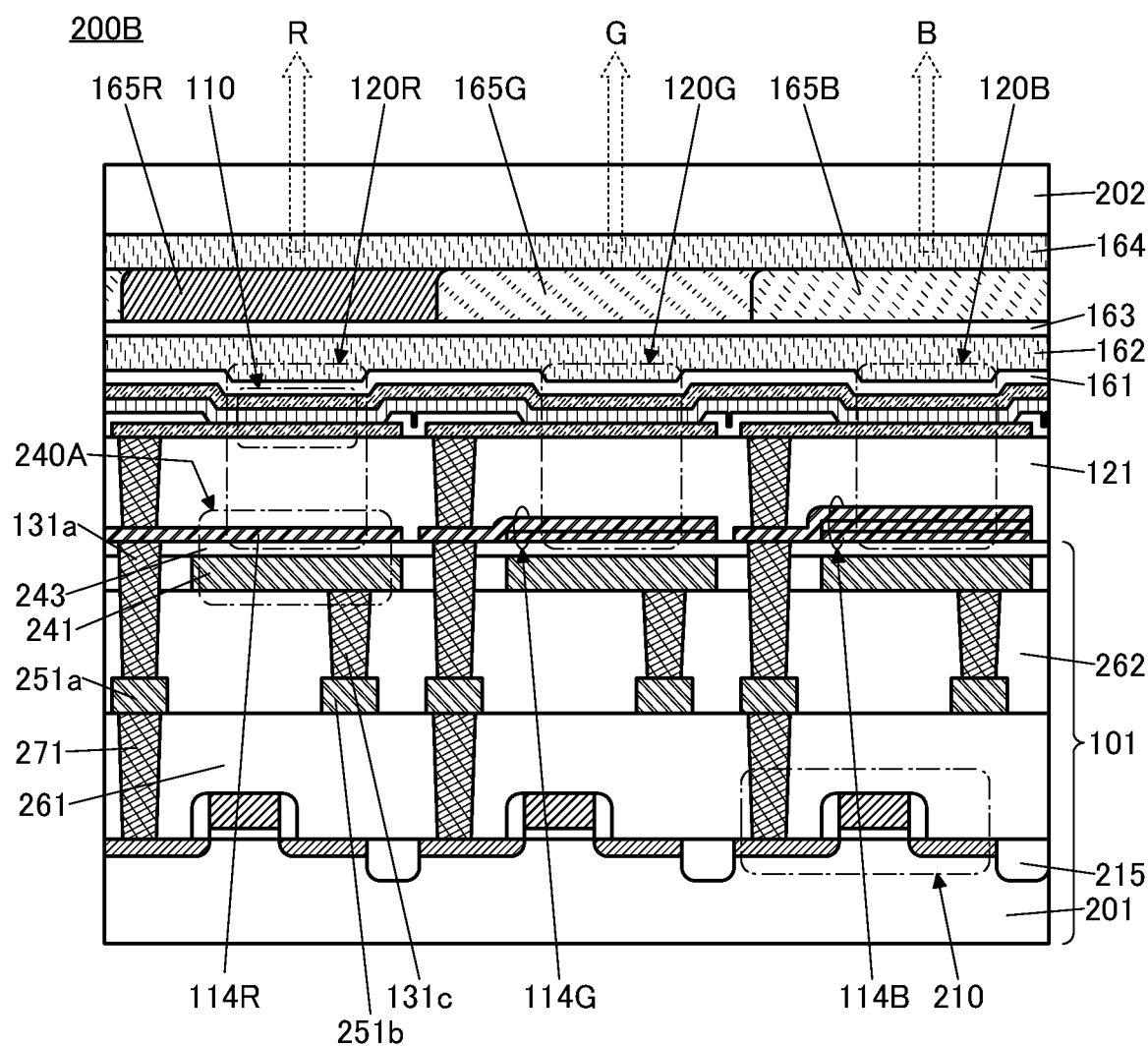
FIG. 8 A structure example of a display device.

A display device 200B illustrated in FIG. 8 is different from the display device 200A mainly in the structure of the capacitor.

The display device 200B illustrated in FIG. 8 has a structure in which the reflective layer 114R, the reflective layer 114G, and the reflective layer 114B each also serve as one electrode of a capacitor 240A.

The reflective layer 114R, the reflective layer 114G, and the reflective layer 114B are provided over the insulating layer 243. The reflective layer 114R, the reflective layer 114G, and the reflective layer 114B are each electrically connected to one of the source and the drain of the transistor 210 through the plug 271, a conductive layer 251a, and the plug 131*a*. The conductive layer 241 is electrically connected to a conductive layer 251*b* through a plug 131*c*.

Such a structure can simplify the fabrication process compared to that for the display device 200A, leading to a reduction in manufacturing cost.

Structure Example 5-2

Figure 9:
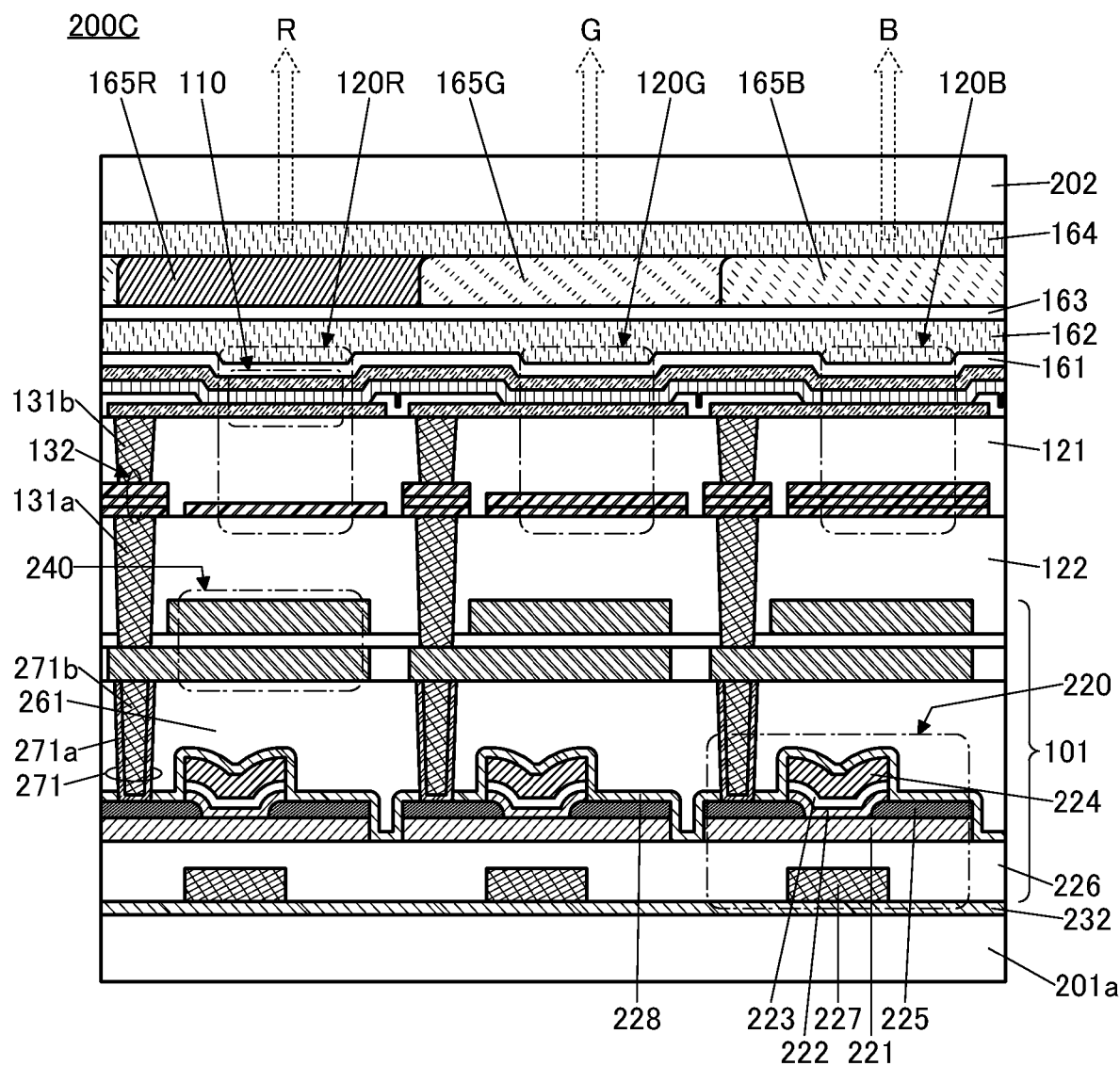
FIG. 9 A structure example of a display device.

FIG. 9 is a schematic cross-sectional view of a display device 200C. The display device 200C is different from the display device 200A mainly in a transistor structure.

A transistor 220 is a transistor in which a metal oxide (also referred to as an oxide semiconductor) is used in a semiconductor layer where a channel is formed.

The transistor 220 includes a semiconductor layer 221, a metal oxide layer 222, an insulating layer 223, a conductive layer 224, a conductive layer 225, an insulating layer 226, a conductive layer 227, and the like.

As a substrate 201*a* over which the transistor 220 is provided, the above-described insulating substrate or semiconductor substrate can be used.

An insulating layer 232 is provided over the substrate 201*a*. The insulating layer 232 functions as a barrier layer that prevents diffusion of impurities such as water and hydrogen from the substrate 201*a* into the transistor 220 and release of oxygen from the semiconductor layer 221 to the insulating layer 232 side. As the insulating layer 232, it is preferable to use, for example, a film in which hydrogen and oxygen are unlikely to be diffused than in a silicon oxide film such as an aluminum oxide film, a hafnium oxide film, and a silicon nitride film.

The conductive layer 227 is provided over the insulating layer 232, and the insulating layer 226 is provided to cover the conductive layer 227. The conductive layer 227 functions as a first gate electrode of the transistor 220, and part of the insulating layer 226 functions as a first gate insulating layer. For the insulating layer 226 at least in a portion in contact with the semiconductor layer 221, an oxide insulating film such as a silicon oxide film is preferably used. In addition, a top surface of the insulating layer 226 is preferably planarized.

The semiconductor layer 221 is provided over the insulating layer 226. The semiconductor layer 221 preferably includes a film of a metal oxide exhibiting semiconductor characteristics (also referred to as an oxide semiconductor). The material that can be suitably used for the semiconductor layer 221 is described in detail later.

The pair of conductive layers 225 is provided over and in contact with the semiconductor layer 221, and functions as a source electrode and a drain electrode. The metal oxide layer 222 is provided to cover the top surface of the semiconductor layer 221 between the pair of conductive layers 225. The metal oxide layer 222 preferably includes a metal oxide that can be used for the semiconductor layer 221. The insulating layer 223 functioning as a second gate insulating layer and the conductive layer 224 functioning as a second gate electrode are provided to be stacked over the metal oxide layer 222.

An insulating layer 228 is provided to cover the transistor 220 and the insulating layer 261 is provided over the insulating layer 228. The insulating layer 228 functions as a barrier layer that prevents diffusion of impurities such as water and hydrogen from the insulating layer 261 or the like to the transistor 220 and release of oxygen from the semiconductor layer 221. As the insulating layer 228, an insulating film similar to the insulating layer 232 can be used.

The plug 271 electrically connected to the conductive layer 225 is provided to be embedded in the insulating layer 261. Here, the plug 271 preferably includes a conductive layer 271*a* covering a side surface of the opening of the insulating layer 261 and part of a top surface of the conductive layer 225, and a conductive layer 271*b* in contact with a top surface of the conductive layer 271*a*. In this case, a conductive material in which hydrogen and oxygen are unlikely to be diffused is preferably used for the conductive layer 271*a*.

Structure Example 5-3

Figure 10:
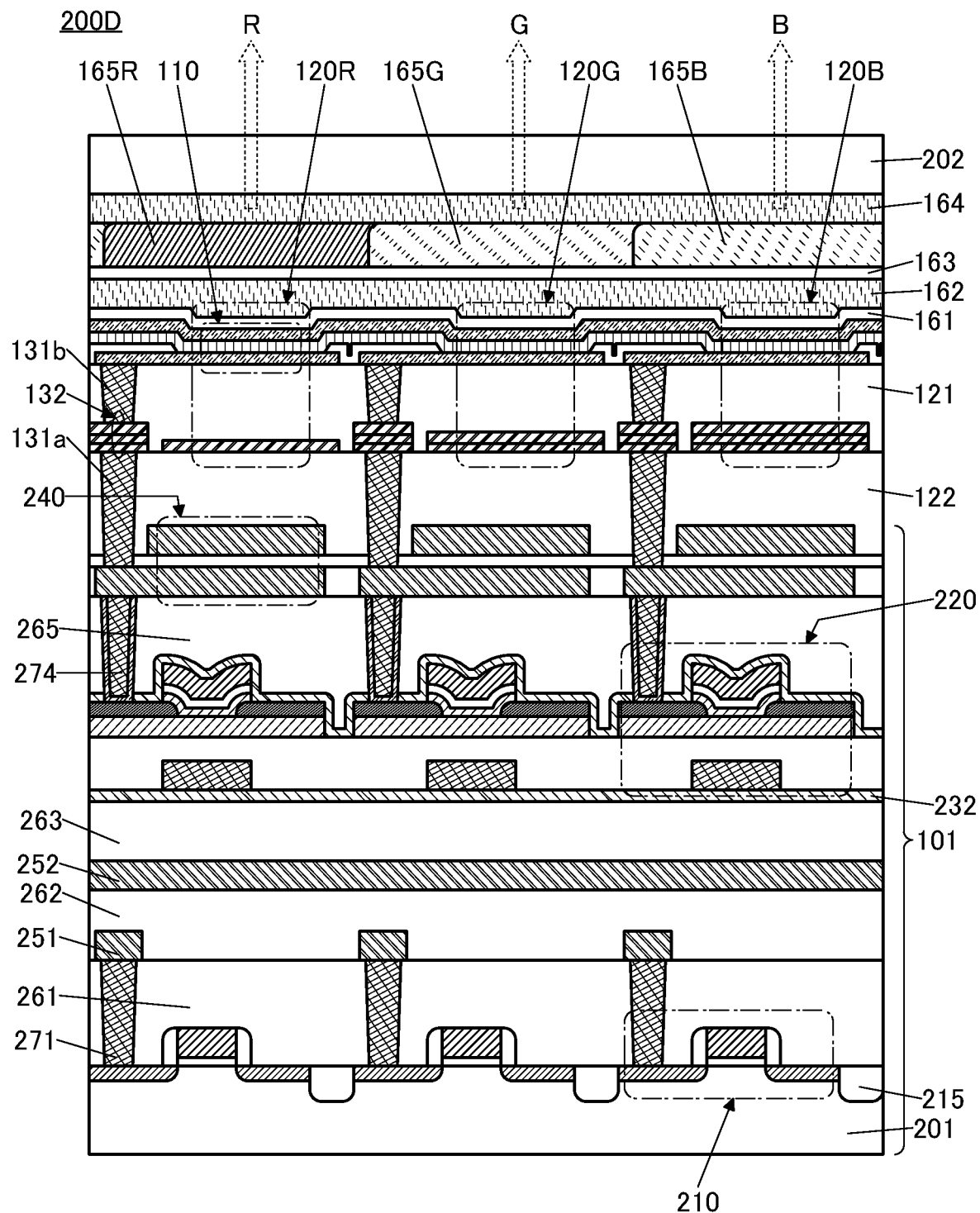
FIG. 10 A structure example of a display device.

FIG. 10 is a schematic cross-sectional view of a display device 200D. The display device 200D has a structure in which the transistor 210 whose channel is formed in the substrate 201 and the transistor 220 including a metal oxide in the semiconductor layer where the channel is formed are stacked.

The insulating layer 261 is provided to cover the transistor 210 and the conductive layer 251 is provided over the insulating layer 261. In addition, an insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 232 are provided to cover the conductive layer 252, and the transistor 220 is provided over the insulating layer 232. An insulating layer 265 is provided to cover the transistor 220, and the capacitor 240 is provided over the insulating layer 265. The capacitor 240 and the transistor 220 are electrically connected to each other through a plug 274.

The transistor 220 can be used as a transistor included in a pixel circuit. The transistor 210 can also be used as a transistor included in a pixel circuit or a transistor included in a driver circuit (a gate line driver circuit or a source line driver circuit) for driving the pixel circuit. The transistor 210 and the transistor 220 can also be used as transistors included in a variety of circuits such as an arithmetic circuit and a memory circuit.

With such a structure, not only the pixel circuit but also the driver circuit or the like can be formed directly under the light-emitting unit; thus, the display device can be downsized as compared with the case where the driver circuit is provided around a display region.

Structure Example 5-4

Figure 11:
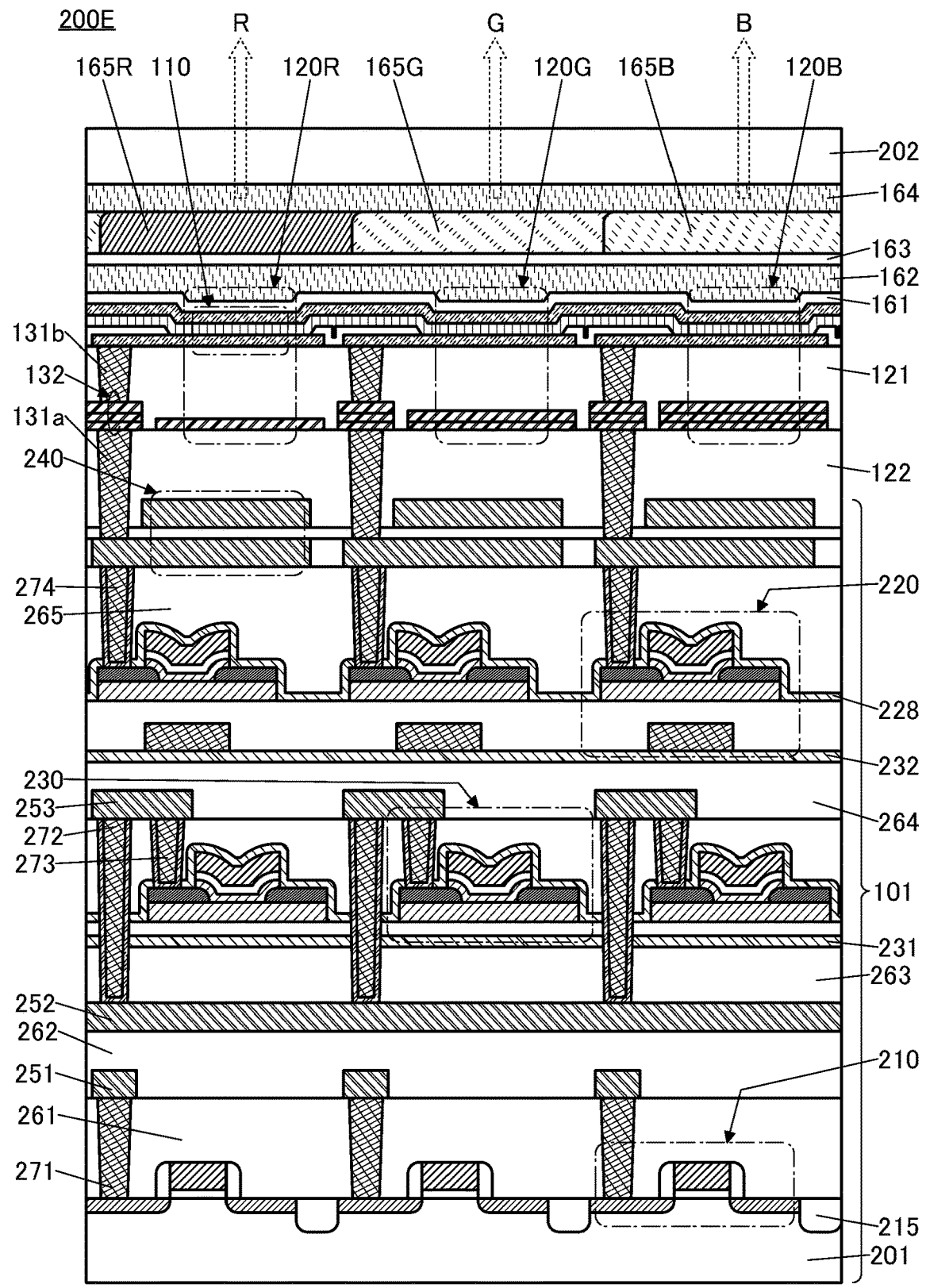
FIG. 11 A structure example of a display device.

FIG. 11 is a schematic cross-sectional view of a display device 200E. The display device 200E is different from the display device 200D mainly in that two transistors using an oxide semiconductor are stacked.

The display device 200E includes a transistor 230 between the transistor 210 and the transistor 220. The transistor 230 has a structure similar to that of the transistor 220 except that the first gate electrode is not included. Note that the transistor 230 may include a first gate electrode like the transistor 220.

The insulating layer 263 and an insulating layer 231 are provided to cover the conductive layer 252, and the transistor 230 is provided over the insulating layer 231. The transistor 230 and the conductive layer 252 are electrically connected to each other through a plug 273, a conductive layer 253, and a plug 272. An insulating layer 264 and the insulating layer 232 are provided to cover the conductive layer 253, and the transistor 220 is provided over the insulating layer 232.

The transistor 220 functions as, for example, a transistor for controlling current flowing through the light-emitting element 110. The transistor 230 functions as a selection transistor for controlling the selection state of a pixel. The transistor 210 functions as a transistor included in a driver circuit for driving the pixel, for example.

When three or more layers in which a transistor is formed are stacked in this manner, the area occupied by the pixel can be further reduced and a high-resolution display device can be achieved.

[Components]

Components such as a transistor that can be used in the display device will be described below.

[Transistor]

The transistors each include a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor, a staggered transistor, or an inverted staggered transistor may be used. A top-gate or a bottom-gate transistor structure may be employed. Gate electrodes may be provided above and below a channel.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, a single-crystal semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

A metal oxide film with low carrier density is used as the semiconductor layer. For example, for the semiconductor layer, a metal oxide whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{13}/cm^3$, and higher than or equal to $1 \times 10^{-9}/cm^3$ can be used. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of elements belonging to Group 14, is contained in the metal oxide contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2 \times 10^{18}$ atoms/cm$^3$, preferably lower than or equal to $2 \times 10^{17}$ atoms/cm$^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is set to lower than or equal to $1 \times 10^{18}$ atoms/cm$^3$, preferably lower than or equal to $2 \times 10^{16}$ atoms/cm$^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to be normally on. Hence, the concentration of nitrogen which is measured by secondary ion mass spectrometry is preferably set to lower than or equal to $5 \times 10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a layered structure including two or more of the above regions in some cases.

<Composition of CAC-OS>

The composition of a CAC (Cloud-Aligned Composite)-OS that can be used in a transistor disclosed in one embodiment of the present invention will be described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)) to form a mosaic pattern, and $InO_{X1}$ or $In_{X2}Zn_{Y2}O_{Z2}$ forming the mosaic pattern is evenly distributed in the film.

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different atomic compositions is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in an a-b plane direction and a c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, with the use of the transistor in a signal line driver circuit that supplies a signal from a signal line of the display device (particularly in a demultiplexer connected to an output terminal of a shift register included in a signal line driver circuit), the display device connected to less number of wirings can be provided.

Furthermore, the transistor including a CAC-OS in the semiconductor layer does not need a laser crystallization step like a transistor including low-temperature polysilicon. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As the silicon, amorphous silicon may be used but silicon having crystallinity is preferably used. For example, microcrystalline silicon, polycrystalline silicon, or single-crystal silicon are preferably used. In particular, polycrystalline silicon can be formed at a temperature lower than that for single crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

Structure Example of Display Module

A structure example of a display module including the display device of one embodiment of the present invention will be described below.

Figure 12A:
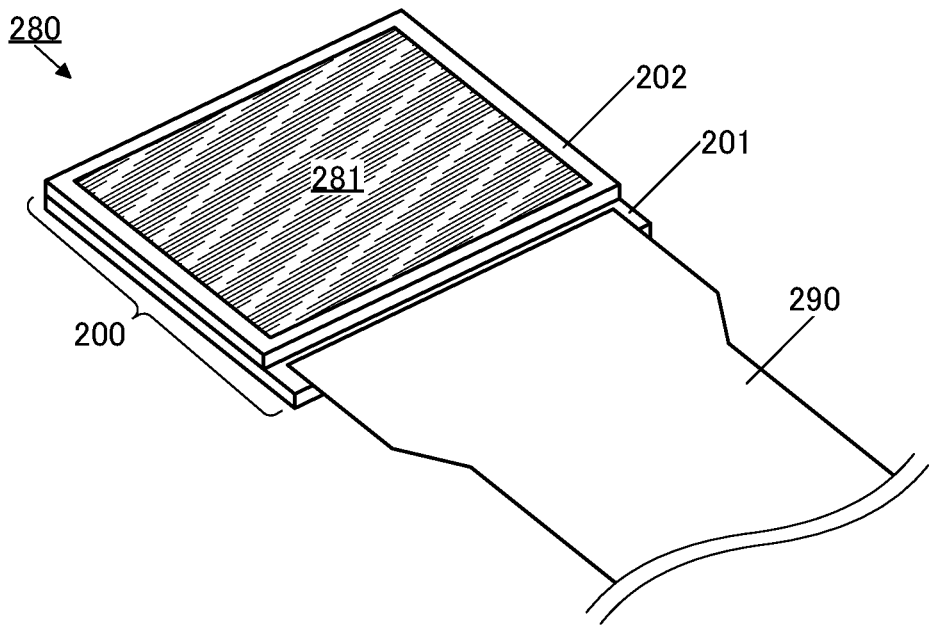
FIGS. 12A and 12B A structure example of a display module.

FIG. 12(A) is a schematic perspective view of a display module 280. The display module 280 includes a display device 200 and an FPC 290. Any of the display devices (the display device 200A to the display device 200E) described in Structure Example 5 can be used as the display device 200.

The display module 280 includes the substrate 201 and the substrate 202. A display portion 281 is also included on the substrate 202 side. The display portion 281 is a region of the display module 280 where an image is displayed and is a region where light emitted from pixels provided in a pixel portion 284 described later can be seen.

Figure 12B:
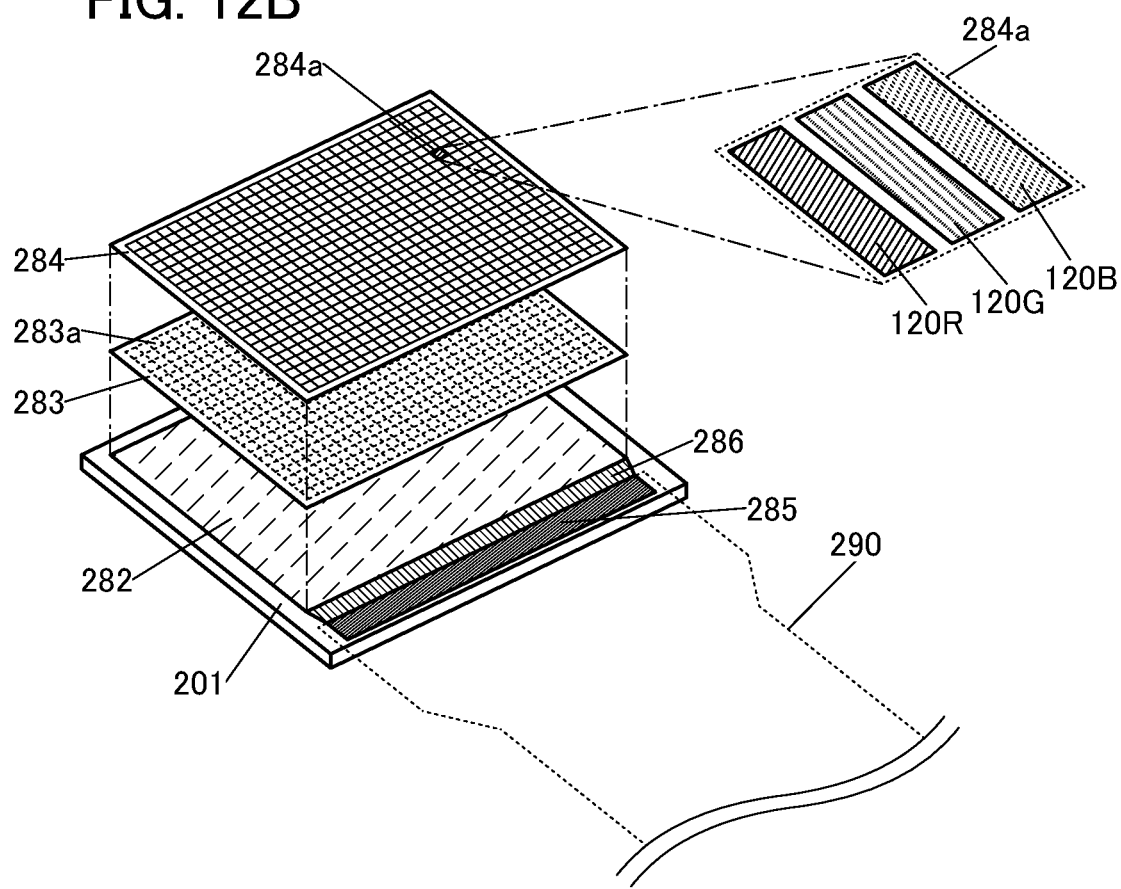

FIG. 12(B) illustrates a perspective view schematically illustrating a structure on the substrate 201 side. The substrate 201 has a structure in which a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 201. The terminal portion 285 and the circuit portion 282 are electrically connected to each other through a wiring portion 286 formed of a plurality of wirings.

The pixel portion 284 includes a plurality of pixels 284a arranged in a matrix. An enlarged view of one pixel 284a is illustrated on the right side of FIG. 12(B). The pixel 284a includes the light-emitting unit 120R, the light-emitting unit 120G, and the light-emitting unit 120B.

The pixel circuit portion 283 includes a plurality of pixel circuits 283a arranged in a matrix. One pixel circuit 283a is a circuit that controls light emission of three light-emitting units included in one pixel 284a. One pixel circuit 283a may be provided with three circuits each of which controls light emission of one light-emitting unit. For example, the pixel circuit 283a can have a structure including at least one selection transistor, one current control transistor (driving transistor), and a capacitor for one light-emitting unit. In this case, a gate signal is input to a gate of the selection transistor and a source signal is input to one of a source and a drain thereof. Thus, an active-matrix display device is achieved.

The circuit portion 282 includes a circuit for driving the pixel circuits 283a in the pixel circuit portion 283. For example, a gate line driver circuit and a source line driver circuit are preferably included. In addition, an arithmetic circuit, a memory circuit, a power supply circuit, or the like may be included.

The FPC 290 functions as a wiring for supplying a video signal or a power supply potential to the circuit portion 282 from the outside. In addition, an IC may be mounted on the FPC 290.

The display module 280 can have a structure in which the pixel circuit portion 283, the circuit portion 282, and the like are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without limitation to the above, the display module 280 can also be suitably used for an electronic device having a relatively small display portion. For example, the display module 280 can be suitably used in a display portion of a wearable electronic device such as a smart watch.

At least part of this embodiment can be implemented in combination with the other embodiments described in this specification as appropriate.

Embodiment 2

In this embodiment, a display device of one embodiment of the present invention will be described with reference to FIG. 13.

Figure 13A:
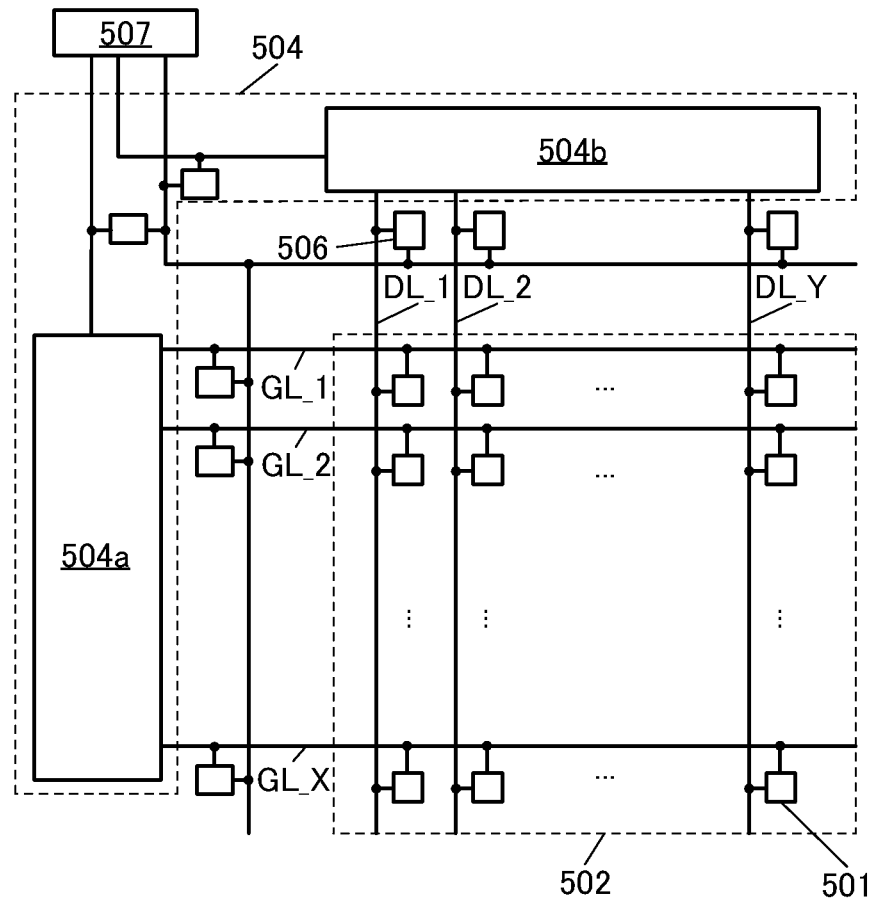
FIGS. 13A and 13B A block diagram and a circuit diagram of a display device.

A display device illustrated in FIG. 13(A) includes a pixel portion 502, a driver circuit portion 504, protection circuits 506, and a terminal portion 507. Note that a structure in which the protection circuits 506 are not provided may be employed.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 13(A) is connected to a variety of wirings such as the scan lines GL that are wirings between the gate driver 504a and the pixel circuits 501 and the data lines DL that are wirings between the source driver 504b and the pixel circuits 501, for example.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

In particular, the gate driver 504a and the source driver 504b are preferably placed below the pixel portion 502.

Figure 13B:
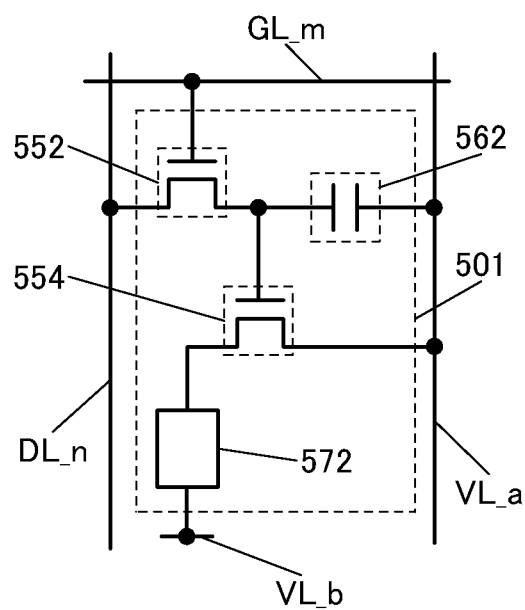

The plurality of pixel circuits 501 illustrated in FIG. 13(A) can have a configuration illustrated in FIG. 13(B), for example.

The pixel circuit 501 illustrated in FIG. 13(B) includes transistors 552 and 554, a capacitor 562, and a light-emitting element 572. A data line DL_n, A scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of this embodiment can be implemented in combination with the other embodiments described in this specification as appropriate.

Embodiment 3

A pixel circuit including a memory for correcting gray levels displayed by pixels that can be used in one embodiment of the present invention and a display device including the pixel circuit will be described below.

[Circuit Configuration]

Figure 14A:
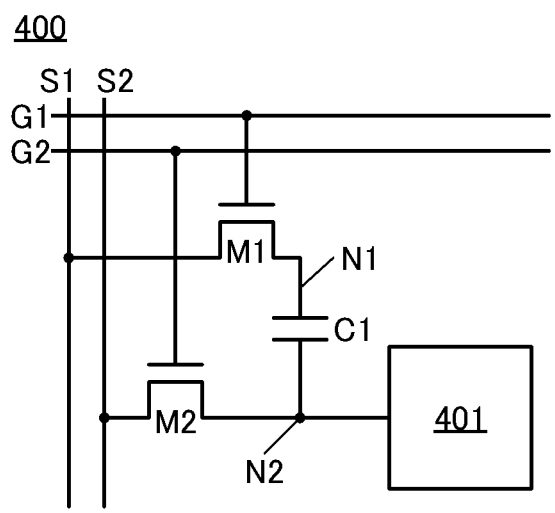
FIGS. 14A to 14C Circuit diagrams and a timing chart of a display device.

FIG. 14(A) is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 14B:
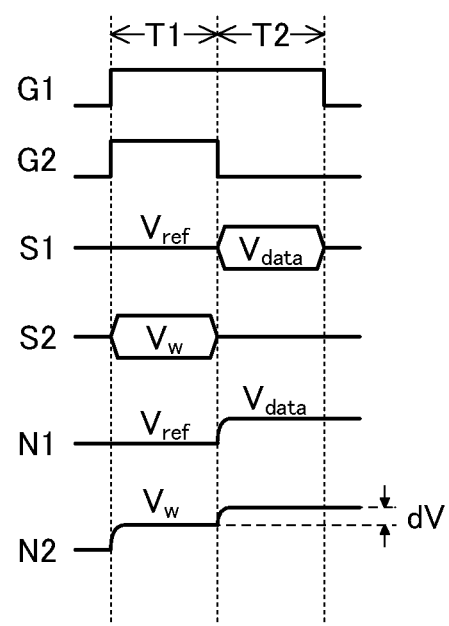

Next, an example of a method for operating the pixel circuit 400 is described with reference to FIG. 14(B). FIG. 14(B) is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 14(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w - V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential Vw and the potential dV is input to the circuit 401. Note that although dV is shown as a positive value in FIG. 14(B), dV may be a negative value. That is, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

Figure 14C:
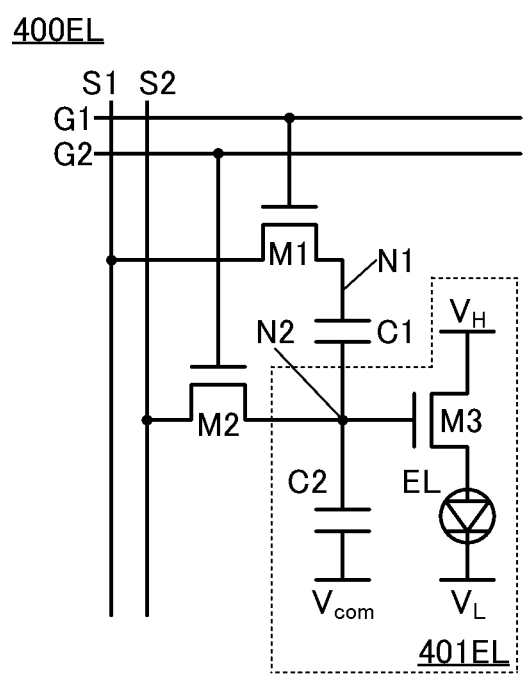

A pixel circuit 400EL illustrated in FIG. 14(C) includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential VH, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 14(C), and a configuration to which a transistor, a capacitor, or the like is further added may be employed.

At least part of this embodiment can be implemented in combination with the other embodiments described in this specification as appropriate.

Embodiment 4

In this embodiment, structure examples of an electronic device for which the display device of one embodiment of the present invention is used will be described.

The display device and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have a high resolution, and thus can be favorably used for an electronic device having a relatively small display portion. The display device and the display module can be favorably used for, for example, the following electronic devices: a watch-type or bracelet-type information terminal device (wearable device); and a wearable device worn on a head, such as a device for VR such as a head mounted display and a glasses-type device for AR.

Figure 15A:
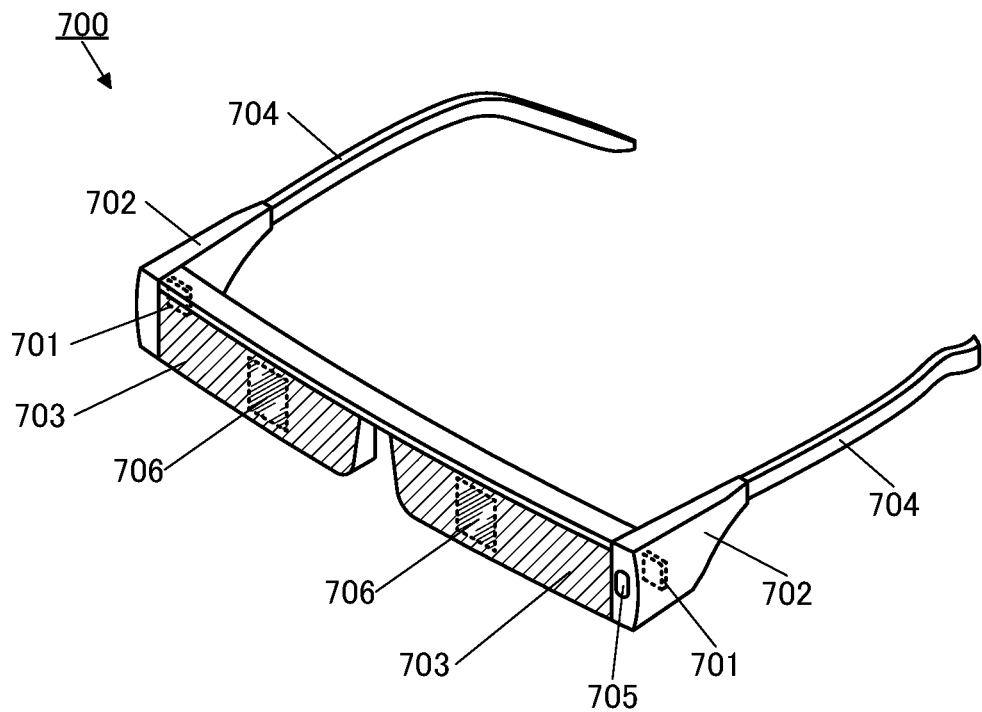
FIGS. 15A and 15B A structure example of an electronic device.

FIG. 15(A) is a perspective view of an electronic device 700 that is of a glasses type. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

The housing 702 each include a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, in which case charging can be performed with or without a wire.

Figure 15B:
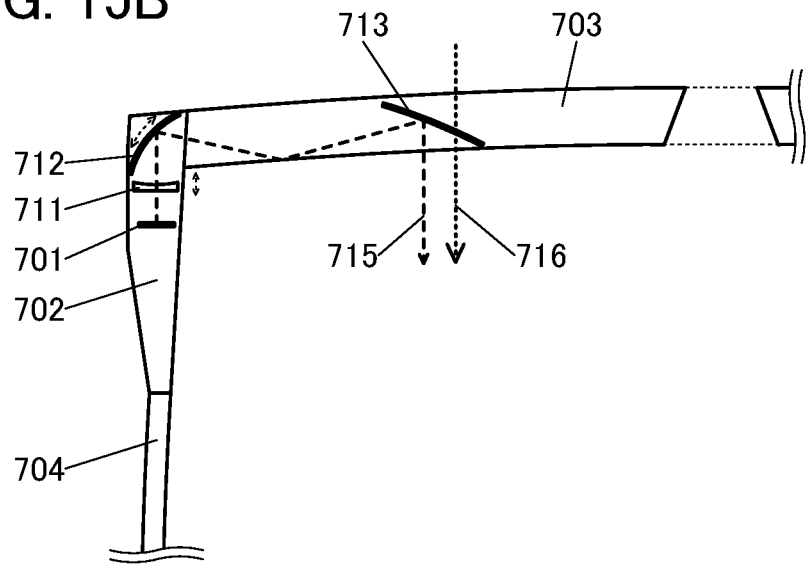

Next, a method for projecting an image on the display region 706 of the electronic device 700 is described with reference to FIG. 15(B). The display panel 701, a lens 711, and a reflective plate 712 are provided in the housing 702. A reflective surface 713 functioning as a half mirror is provided in a portion corresponding to the display region 706 of the optical member 703.

Light 715 emitted from the display panel 701 passes through the lens 711 and is reflected by the reflective plate 712 to the optical member 703 side. In the optical member 703, the light 715 is fully reflected repeatedly by end surfaces the optical member 703 and reaches the reflective surface 713, whereby an image is projected on the reflective surface 713. Accordingly, the user can see both the light 715 reflected by the reflective surface 713 and transmitted light 716 transmitted through the optical member 703 (including the reflective surface 713).

FIG. 15 shows an example in which the reflective plate 712 and the reflective surface 713 each have a curved surface. This can increase optical design flexibility and reduce the thickness of the optical member 703, compared to the case where they have flat surfaces. Note that the reflective plate 712 and the reflective surface 713 may be flat.

The reflective plate 712 can use a component having a mirror surface, and preferably has high reflectivity. As the reflective surface 713, a half mirror utilizing reflection of a metal film may be used, but the use of prism utilizing total reflection or the like can increase the transmittance of the transmitted light 716.

Here, the housing 702 preferably includes a mechanism for adjusting the distance and angle between the lens 711 and the display panel 701. This enables operations such as focus adjustment and zooming in/out of image. One or both of the lens 711 and the display panel 701 is preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The display device or the display module of one embodiment of the present invention can be used for the display panel 701. Thus, the electronic device 700 can perform display with extremely high resolution.

Figure 16A:
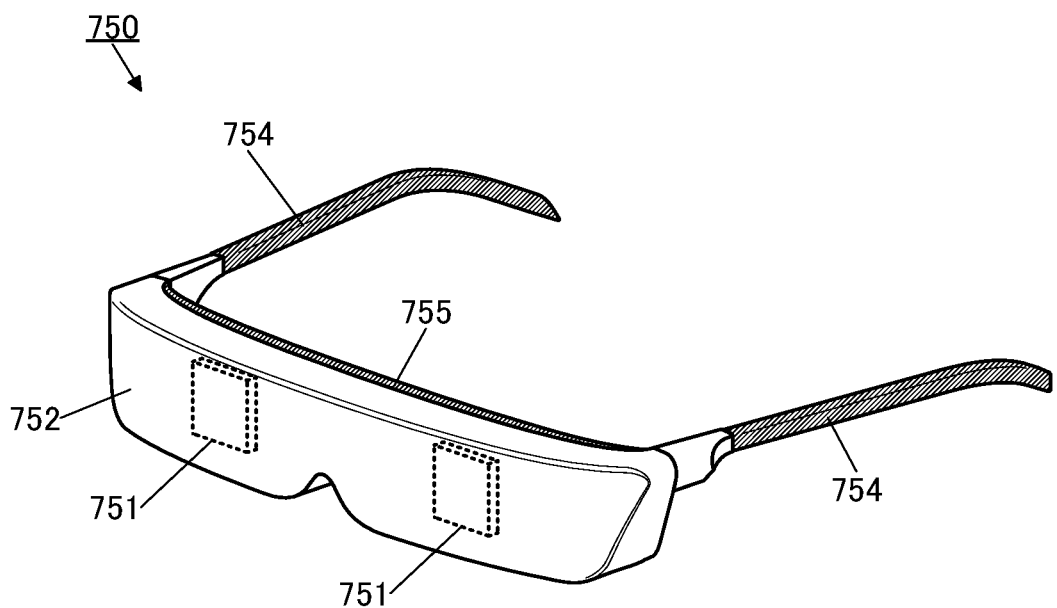
FIGS. 16A and 16B A structure example of an electronic device.
Figure 16B:
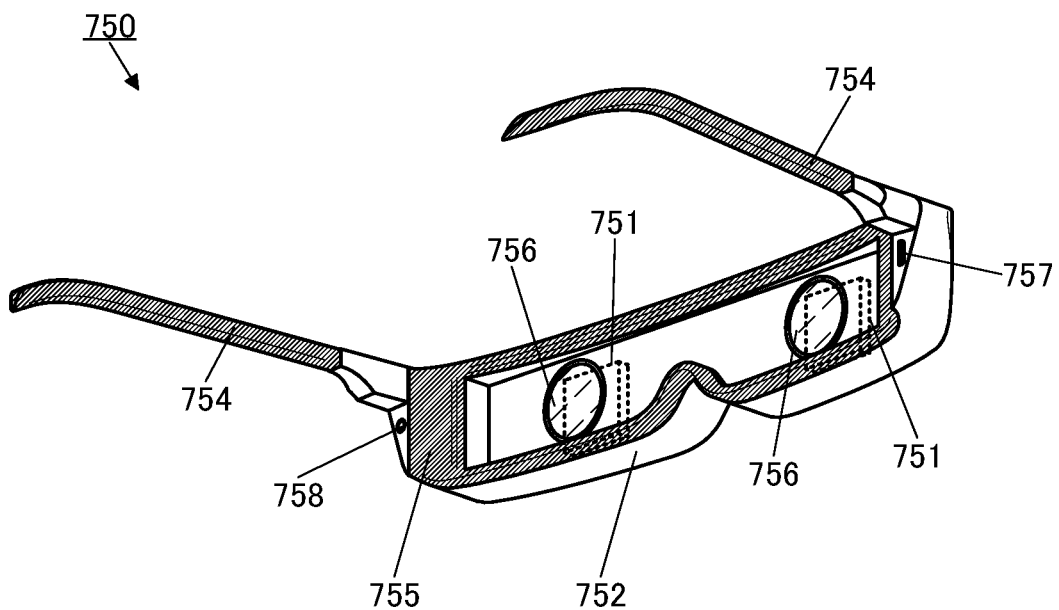

FIGS. 16(A) and 16(B) illustrate perspective views of an electronic device 750 that is of a goggle-type. FIG. 16(A) is a perspective view illustrating the front surface, the top surface, and the left side surface of the electronic device 750, and FIG. 16(B) is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, when the pair of display panels 751 displays different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that in the case where audio data can be output by wireless communication or sound is output from an external video output device, the audio output terminal is not necessarily provided.

In addition, the housing 752 preferably includes a mechanism by which the left and right positions of the lens 756 and the display panel 751 can be adjusted to the optimal positions in accordance with the position of the user's eye. In addition, the housing 752 preferably includes a mechanism for adjusting focus by changing the distance between the lens 756 and the display panel 751.

The display device or the display module of one embodiment of the present invention can be used for the display panel 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

At least part of this embodiment can be implemented in combination with the other embodiments described in this specification as appropriate.

REFERENCE NUMERALS

100: display device, 100A-E: display device, 101: substrate, 110: light-emitting element, 110B: light-emitting element, 110G: light-emitting element, 110R: light-emitting element, 111: conductive layer, 111B: conductive layer, 111G: conductive layer, 111R: conductive layer, 112: EL layer, 113: conductive layer, 114: reflective layer, 114B: reflective layer, 114G: reflective layer, 114R: reflective layer, 115: insulating layer, 116G: reflective layer, 116R: reflective layer, 120B: light-emitting unit, 120G: light-emitting unit, 120R: light-emitting unit, 121: insulating layer, 121f: insulating film, 122: insulating layer, 131a: plug, 131b: plug, 131bf: conductive film, 131c: plug, 132: conductive layer, 141: conductive layer, 141f: conductive film, 142: conductive layer, 142f: conductive film, 143: conductive layer, 143f: conductive film, 144: conductive layer, 145: conductive layer, 146B: insulating layer, 146G: insulating layer, 146R: insulating layer, 151: resist mask, 152: resist mask, 153: resist mask, 161: insulating layer, 162: insulating layer, 163: insulating layer, 164: adhesive layer, 165B: coloring layer, 165G: coloring layer, 165R: coloring layer, 200: display device, 200A-E: display device, 201: substrate, 201a: substrate, 202: substrate, 210: transistor, 211: conductive layer, 212: low-resistance region, 213: insulating layer, 214: insulating layer, 215: element isolation layer, 220: transistor, 221: semiconductor layer, 222: metal oxide layer, 223: insulating layer, 224: conductive layer, 225: conductive layer, 226: insulating layer, 227: conductive layer, 228: insulating layer, 230: transistor, 231: insulating layer, 232: insulating layer, 240: capacitor, 240A: capacitor, 241: conductive layer, 242: conductive layer, 243: insulating layer, 251: conductive layer, 251a: conductive layer, 251b: conductive layer, 252: conductive layer, 253: conductive layer, 261: insulating layer, 262: insulating layer, 263: insulating layer, 264: insulating layer, 265: insulating layer, 271: plug, 271a: conductive layer, 271b: conductive layer, 272: plug, 273: plug, 274: plug, 280: display module, 281: display portion, 282: circuit portion, 283: pixel circuit portion, 283a: pixel circuit, 284: pixel portion, 284a: pixel, 285: terminal portion, 286: wiring portion, 290: FPC

The invention claimed is:

1. A display device comprising:
   a first optical adjustment layer and a second optical adjustment layer;
   a first insulating layer over the first optical adjustment layer and the second optical adjustment layer;
   a first plug and a second plug over the first insulating layer;
   a first light-emitting element over the first insulating layer, the first light-emitting element overlapping with the first optical adjustment layer and electrically connected to the first plug; and
   a second light-emitting element over the first insulating layer, the second light-emitting element overlapping with the second optical adjustment layer and electrically connected to the second plug,
   wherein each of the first light-emitting element and the second light-emitting element comprises a lower electrode having a light-transmitting property, a light-emitting layer, and an upper electrode having a semi-transmissive property and a semi-reflective property,
   wherein at least top surfaces of the first optical adjustment layer and the second optical adjustment layer are each configured to reflect visible light,
   wherein the first optical adjustment layer is thinner than the second optical adjustment layer,
   wherein the first plug is positioned inside a first opening of the first insulating layer,
   wherein the second plug is positioned inside a second opening of the first insulating layer,
   wherein the first plug is electrically connected to the first optical adjustment layer,
   wherein the second plug is electrically connected to the second optical adjustment layer,
   wherein the first optical adjustment layer serves as one electrode of a first capacitor, and
   wherein the second optical adjustment layer serves as one electrode of a second capacitor.

2. The display device according to claim 1, further comprising a third light-emitting element and a third optical adjustment layer,
   wherein at least a top surface of the third optical adjustment layer is configured to reflect visible light, wherein the third optical adjustment layer is thicker than the first optical adjustment layer and the second optical adjustment layer, and wherein a lower electrode of the third light-emitting element is in contact with the top surface of the third optical adjustment layer.

3. The display device according to claim 1, wherein the first optical adjustment layer comprises a first film, wherein the second optical adjustment layer comprises a second film and a third film, and wherein the first film and the third film are formed by processing the same film.

4. The display device according to claim 1, wherein the first optical adjustment layer has conductivity, and wherein the first optical adjustment layer and the lower electrode of the first light-emitting element are electrically connected to each other.

5. The display device according to claim 1, further comprising:

a second insulating layer below the first optical adjustment layer; and a circuit layer comprising a transistor below the second insulating layer, wherein the transistor and the first light-emitting element are electrically connected to each other.

6. The display device according to claim 5, wherein a channel formation region of the transistor comprises a metal oxide having crystallinity or single crystal silicon.

7. A display device comprising:

a first optical adjustment layer and a second optical adjustment layer;

a first insulating layer over the first optical adjustment layer and the second optical adjustment layer;

a first light-emitting element over the first insulating layer, the first light-emitting element overlapping with the first optical adjustment layer; and a second light-emitting element over the first insulating layer, the second light-emitting element overlapping with the second optical adjustment layer, wherein each of the first light-emitting element and the second light-emitting element comprises a lower electrode having a light-transmitting property, a light-emitting layer, and an upper electrode having a semi-transmissive property and a semi-reflective property, wherein at least top surfaces of the first optical adjustment layer and the second optical adjustment layer are each configured to reflect visible light, wherein the first optical adjustment layer is thinner than the second optical adjustment layer, and wherein the lower electrode of the first light-emitting element is thicker than the lower electrode of the second light-emitting element.

8. The display device according to claim 7, further comprising a third light-emitting element and a third optical adjustment layer, wherein at least a top surface of the third optical adjustment layer is configured to reflect visible light, wherein the third optical adjustment layer is thicker than the first optical adjustment layer and the second optical adjustment layer, and wherein a lower electrode of the third light-emitting element is in contact with the top surface of the third optical adjustment layer.

9. The display device according to claim 7, wherein the lower electrode of the first light-emitting element is positioned inside a first opening of the first insulating layer, and wherein the lower electrode of the second light-emitting element is positioned inside a second opening of the first insulating layer.

10. The display device according to claim 7, wherein the first optical adjustment layer comprises a first film, wherein the second optical adjustment layer comprises a second film and a third film, and wherein the first film and the third film are formed by processing the same film.

11. The display device according to claim 7, wherein the first optical adjustment layer has conductivity, and wherein the first optical adjustment layer and the lower electrode of the first light-emitting element are electrically connected to each other.

12. The display device according to claim 7, further comprising:

a second insulating layer below the first optical adjustment layer; and a circuit layer comprising a transistor below the second insulating layer, wherein the transistor and the first light-emitting element are electrically connected to each other.

13. The display device according to claim 12, wherein a channel formation region of the transistor comprises a metal oxide having crystallinity or single crystal silicon.

* * * * *